United States Patent
Roohparvar et al.

[11] Patent Number: 6,067,598
[45] Date of Patent: *May 23, 2000

[54] MEMORY SYSTEM HAVING PROGRAMMABLE FLOW CONTROL REGISTER

[75] Inventors: Frankie F. Roohparvar, Cupertino; Christophe J. Chevallier, Palo Alto, both of Calif.

[73] Assignee: Micron Technology, Inc., Boise, Id.

[*] Notice: This patent is subject to a terminal disclaimer.

[21] Appl. No.: 08/789,761

[22] Filed: Jan. 28, 1997

Related U.S. Application Data

[63] Continuation of application No. 08/508,921, Jul. 28, 1995, Pat. No. 5,619,453.

[51] Int. Cl.[7] .......................... G06F 12/00; G11C 29/00
[52] U.S. Cl. ................. 711/103; 711/100; 365/189.05; 365/185.33
[58] Field of Search ...................... 395/427; 365/185.33, 365/120, 189.05, 222; 711/100, 103, 5, 118, 3

[56] References Cited

U.S. PATENT DOCUMENTS

| | | | |
|---|---|---|---|
| 5,369,754 | 11/1994 | Fandrich et al. | 395/425 |
| 5,377,199 | 12/1994 | Fandrich | 371/22.3 |
| 5,414,664 | 5/1995 | Lin et al. | 365/218 |
| 5,428,568 | 6/1995 | Kobayashi et al. | 365/185 |
| 5,463,757 | 10/1995 | Fandrich et al. | 395/430 |
| 5,509,134 | 4/1996 | Fandrich et al. | 711/103 |
| 5,526,311 | 6/1996 | Kreifels et al. | 365/201 |
| 5,596,530 | 1/1997 | Lin et al. | 365/189.25 |
| 5,602,789 | 2/1997 | Endoh et al. | 365/201 |
| 5,619,453 | 4/1997 | Roohparvar | 365/189.01 |
| 5,627,784 | 5/1997 | Roohparvar | 365/189.01 |
| 5,648,929 | 7/1997 | Miyamoto | 365/185.04 |
| 5,673,222 | 9/1997 | Fukumoto et al. | 365/185.04 |

*Primary Examiner*—Tuan V. Thai
*Attorney, Agent, or Firm*—Schwegman, Lundberg, Woessner & Kluth P.A.

[57] ABSTRACT

A non-volatile memory system having mechanism for altering the sequence of operations carried out under the control of an internal state machine which controls the data processing operations performed on the memory system. A flow control register is used to bypass an operation that would be carried out during the normal functioning of the memory system, where the register contains data bits which can be set to alter the operation of the internal state machine. The memory system is first placed into a test mode which is not accessible under the normal operating conditions. After entering the test mode, data can be written to or read from the flow control register. The data in the flow control register is used to alter the process flow of the memory system, thereby allowing a system designer to monitor how changes in the process flow improve the operation of the system. The present invention can be used to optimize the overall performance of the memory system or to investigate how each step in the process flow impacts later steps.

17 Claims, 12 Drawing Sheets

| FLOW CONTROL REGISTER | SKIP PRE-PROGRAM | SKIP ERASE HIGH V | SKIP DISTRIBUTION TIGHTENING | SKIP PRE-PROGRAM VERIFY | SKIP ERASE VERIFY | SKIP PROGRAM VERIFY | SKIP FINAL ERASE | RESERVED |
|---|---|---|---|---|---|---|---|---|
| BIT | 8 | 7 | 6 | 5 | 4 | 3 | 2 | 1 |

FIG. 4

MEMORY SYSTEM HAVING PROGRAMMABLE FLOW CONTROL REGISTER

This is a continuation of application Ser. No. 08/508,921, filed Jul. 28, 1995 now U.S. Pat. No. 5,619,453.

TECHNICAL FIELD

The present invention relates to non-volatile memory systems, and more specifically, to a memory system having a register which can be used to alter the functioning of an internal state machine which controls the operations of a memory system, such as a flash memory system. This permits a memory system designer to optimize the process flow of the operations controlled by the internal state machine.

BACKGROUND OF THE INVENTION

In early integrated circuit memory systems, the detailed operation of the memory system was controlled directly by a processor unit which utilized the memory. Since the operation of many memory systems requires a substantial amount of processor overhead, and since different manufacturers require different operations for optimizing their particular memories, many such systems now include an internal state machine for controlling the detailed operation of the memory system. The internal state machine controls the primary operations of the memory system, including reading, programming and erasing operations. Each of these primary operations is comprised of a large number of sub-operations which are necessary to carry out the primary operations, with these sub-operations also being controlled by the state machine.

The operating characteristics of integrated circuit memory systems, especially large capacity memory systems, depend upon many factors. These factors include process variations during the fabrication of the memory system. Thus, two memory systems which are nominally the same, may nevertheless have different operating characteristics which are not ascertainable until the memory systems are actually fabricated. The internal state machine of the memory system needs to be implemented in a manner which takes into account these variations in memory characteristics, while providing a memory system which meets certain performance specifications. Thus, the internal state machine cannot be optimized for a particular set of memory system characteristics, but must be implemented in a manner which provides adequate operation over a range of memory characteristics.

Once an integrated memory system has been fabricated, it is possible to characterize the system, but it is no longer possible to alter the manner in which the state machine carries out the memory system sub-operations. As will be explained in greater detail, the present invention permits the operation of the internal state machine to be altered after fabrication of the memory system. This means that operation of the state machine, particularly with respect to the sub-operations, can be optimized to take into account the actual characteristics of the memory system. By altering the operation of the internal state machine, the sub-operations themselves can be characterized and the impact of the sub-operations on the overall process flow can be determined.

FIG. 1 is a functional block diagram of a conventional flash memory system 1. The core of memory system 1 is an array 12 of flash memory cells. The individual cells in array 12 are arranged in rows and columns, with there being, for example, a total of 256K eight bit words in array 12. The individual memory cells (not shown) are accessed by using an eighteen bit address A0–A17, which is input by means of address pins 13. Nine of the eighteen address bits are used by X decoder 14 to select the row of array 12 in which a desired memory cell is located and the remaining nine bits are used by Y decoder 16 to select the appropriate column of array 12 in which the desired cell is located.

Memory system 1 contains an internal state machine (ISM) 20 which controls the data processing operations and sub-operations performed on memory array 12. These include the steps necessary for carrying out programming, reading and erasing operations on the memory cells of array 12. In addition, internal state machine 20 controls such operations as reading or clearing status register 26, identifying memory system 1 in response to an identification command, and suspending an erase operation. State machine 20 functions to reduce the overhead required of an external processor (not depicted) typically used in association with memory system 1.

For example, if memory cell array 12 is to be erased (typically, all or large blocks of cells are erased at the same time), the external processor causes the output enable pin $\overline{OE}$ to be inactive (high), and the chip enable $\overline{CE}$ and write enable $\overline{WE}$ pins to be active (low). The processor then issues an 8 bit command 20H (0010 0000) on data I/O pins 15 (DQ0–DQ7), typically called an Erase Setup command. This is followed by the issuance of a second eight bit command D0H (1101 0000), typically called an Erase Confirm command. Two separate commands are used to initiate the erase operation so as to minimize the possibility of inadvertently beginning an erase procedure.

The commands issued on I/O pins 15 are transferred to data input buffer 22 and then to command execution logic unit 24. Command execution logic unit 24 receives and interprets the commands used to instruct state machine 20 to perform the steps required for erasing array 12 or carrying out another desired operation. Once the desired operation sequence is completed, state machine 20 updates 8 bit status register 26. The contents of status register 26 is transferred to data output buffer 28, which makes the contents available on data I/O pins 15 of memory system 1. Status register 26 permits the external processor to monitor certain aspects of the status of state machine 20 during memory array write and erase operations. The external processor periodically polls data I/O pins 15 to read the contents of status register 26 in order to determine whether an erase sequence (or other operation) has been completed and whether the operation was successful.

As noted, the contents of status register 26 provides information to a user of memory system 1 concerning the internal operation of the memory system. This information includes the status (ready or busy) of state machine 20, whether an erase or write operation has been successful, whether an erase operation has been suspended, and whether the write/erase supply voltage ($V_{PP}$) is present.

In programming or erasing the memory elements contained in array 12, memory system 1 accesses each memory element and evaluates the margins (the voltage differential between the threshold voltage of the memory cells and ground level) that the element has after the operation. The system then decides whether the element needs to be reprogrammed or erased further to achieve a desired operational margin. This treatment of the memory elements requires control logic-that causes the memory system to be very complicated.

The memory array needs to be programmed first in a pre-programming cycle before it can be erased. This is to avoid over-erasing the bits in some memory elements to a negative threshold voltage, thereby rendering the memory inoperative. During this cycle of pre-programming, the memory system needs to check to see if the bits are programmed to a sufficient level. This is accomplished by a programming verification cycle that uses a different evaluation procedure than a regular read operation would use. After successful completion of the pre-programming cycle, a high voltage erase operation is executed. After the erase operation is completed, some memory systems go through an operation to tighten the distribution (reduce the variance) of memory element threshold voltages for ease of manufacturing. After this procedure, the memory system may perform a reverify operation to determine if the data in the memory array has remained undisturbed.

FIG. 2 is a state diagram showing the process flow (sub-operations) of a typical memory system of the type shown in FIG. 1 during the pre-programming, high voltage erase, and distribution adjustment stages which occur during a complete erase operation. The complete erase operation starts with a pre-program cycle 200. This sub-operation programs all the elements in the memory array to a logic 0 value to make sure that the erase process starts from a known cell threshold voltage level. This part of the complete erase operation is used to reduce the possibility of over erasure of some of the memory elements during the later steps.

The pre-program cycle begins with an operation which increments the address of the memory cell which is to be pre-programmed 202. This is done because the pre-programming operation is executed on a cell by cell basis. This step is followed by a high voltage level set-up stage 204 which prepares the system for application of the high voltage levels (typically about 12 volts is applied to the gate of each memory cell and 6 volts to the drain) used for programming a cell. The high voltage level used for writing to (programming) the cell is then applied in stage 206.

The appropriate voltage levels for executing the data verification sequence (reading the data programmed in the cell and comparing it to a desired value) are applied to the appropriate circuitry at stage 208. This is followed by a program verification stage 210 which verifies that the programmed cell has sufficient margin. This is typically accomplished by comparing the threshold voltage of the cell to a reference cell having a desired threshold voltage. If the verification operation was not successful, steps 204, 206, 208, and 210 are repeated. Once the verification stage for a particular memory cell is successfully completed, it is followed by a program clean up stage 212.

Program clean up stage 212 conditions all internal nodes of the memory array to default values in order to prepare the memory system for the next operation. This concludes the pre-programming cycle for a given memory cell. The address of the cell to be operated on is then incremented at stage 202 and the process repeats itself until the last cell in a memory block to be erased is programmed. At this time, the incremented address will point to the first address location in the block, which is the first address for the next operation. When this occurs, all of the memory cells have been successfully pre-programmed and control is passed to the high voltage erase cycle 220.

In the erase cycle, the memory system performs a block erase operation on all of the cells contained in a block of memory. The first stage in the cycle is a high voltage level set-up stage 222 which prepares the memory block for application of the high voltage pulse(es) used for erasing the cells. This is followed by a high voltage stage 224 in which a short, high voltage pulse is applied to erase all of the memory cells in the block of cells. This is followed by a set-up verify stage 226 which applies the appropriate voltage levels for the data verification stage to the corresponding circuits. The next stage is an erase verify stage 228 which verifies that the erase operation was successfully carried out on each cell in the block. This is accomplished by accessing the cells, address by address and comparing the threshold voltage of the cell to a reference cell having a desired threshold voltage.

If the erase operation was not successfully carried out (a cell was not erased to the proper margin), control is passed back to the high voltage level set-up stage 222 and the high voltage cycle is carried out again to erase the entire block of cells. If the erase operation was successful for the cell under consideration, the address of the memory cell is incremented 230 and the next cell is tested for verification of the erase operation. Thus, if the maximum address of the cells in the block of memory has not been reached, erase verify stage 228 is carried out on the next memory cell in the block. If the maximum address for cells in the block has been reached (meaning that all the cells in the memory block have been successfully erased), control is passed to the distribution adjustment stage 240.

The distribution adjustment sub-operation 240 is used to tighten the distribution (reduce the variance) of the threshold voltages of the erased memory elements. This is done by applying high voltages (i.e., 12 volts) to the gates of all the memory cells in the memory block, with the memory cell drains floating and the sources at ground potential.

The distribution adjustment cycle begins with a high voltage set-up stage 242, which is followed by a high voltage stage 244 in which the voltages used to perform the adjustment sub-operation are applied. This is followed by set-up verification 246 stage which applies the appropriate voltage levels to the corresponding circuits, and erase verification 248 stage which acts to insure that all of the erased cells are still in an erased state. If the erase verification procedure fails, a final erase 249 stage may be executed. In the final erase stage, a short erase pulse is applied to the cells in the block. After completion of the previous steps, the memory elements are checked to determine if they still contain the appropriate data. At this point the erase operation is completed.

As is apparent, even a general description of a complete erase operation is quite complicated. When designing a flash memory system, the designer is often not aware of all the problems that may be present when the part is manufactured. These problems can result from the manufacturing process or be due to operational constraints that were not apparent during the design stage. As a result, the internal state machine that controls the operation of the memory system is purposely made to be very complex. After fabrication of the memory system, the system is cycled through its operations to determine whether the sequence of operations and sub-operations can be further optimized. If it is shown that the operation of the memory system is not optimal for its intended use, the circuit design is modified to improve its performance.

Modification of the memory system is usually carried out by re-designing and re-fabricating the part. As a typical memory system can contain thousands of logic gates, this process is both time consuming and expensive. In addition, most memory system designs do not permit an evaluation of how each step in the flow of the system's operation affects the other steps. This information can be useful in determining how a variation of one process step or parameter impacts the overall performance of the memory system.

What is desired is a memory system whose performance can be optimized without the necessity of re-designing and re-manufacturing the system. It is also desired to have a means for evaluating the impact of each step in the system's operation on the other steps so that the overall performance of the memory system can be improved. These and other advantages of the present invention will be apparent to those skilled in the art upon a reading of the following Detailed Description of the Invention together with the drawings.

SUMMARY OF THE INVENTION

The present invention is directed to a non-volatile memory system having means for altering the sequence of operations and sub-operations carried out under the control of an internal state machine which controls the data processing operations performed on the memory system. This is accomplished by using a flow control register containing data bits which can be set to cause the internal state machine to bypass an operation that would otherwise be carried out during the normal functioning of the memory system.

In order to alter the process flow of the memory system, the system is first placed into a test mode which is not accessible under the normal operating conditions. After entering the test mode, data can be written to or read from the flow control register. The data in the flow control register is then used to alter the process flow of the memory system, thereby allowing a system designer to monitor how changes in the process flow influence the operation of the system. The present invention can be used to optimize the overall performance of the memory system or to investigate how each step in the process flow impacts later steps.

Further objects and advantages of the present invention will become apparent from the following detailed description and accompanying drawings.

BRIEF DESCRIPTION OF THE DRAWINGS

FIG. 4 is a diagram showing the contents of an embodiment of the flow control register of the present invention.

DETAILED DESCRIPTION OF THE INVENTION

Figure 3:
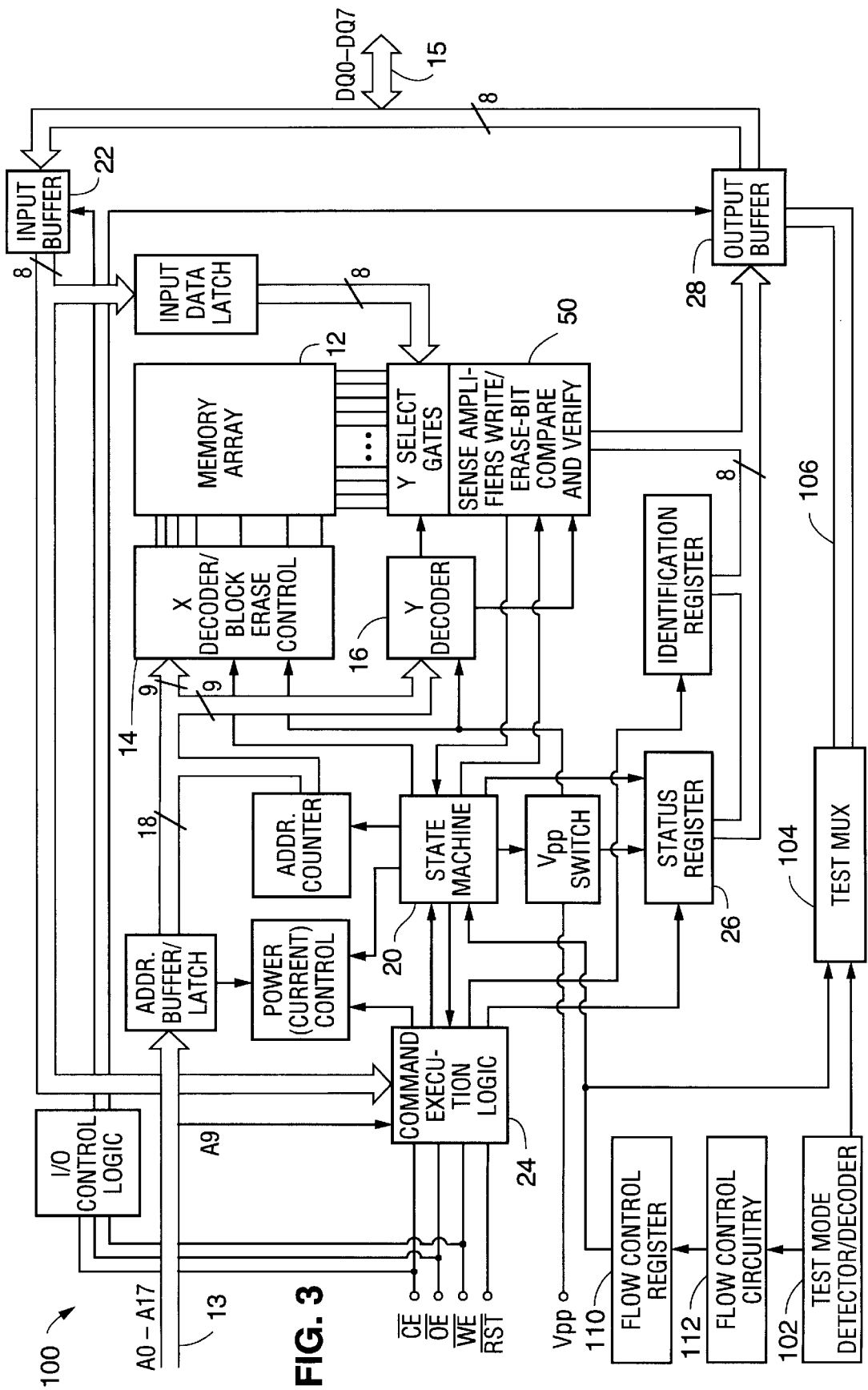
FIG. 3 is a functional block diagram of a flash memory system of the present invention which includes a flow control register for altering the process flow of the operations carried out by the system's internal state machine.

Referring again to the drawings, FIG. 3 is a functional block diagram of a flash memory system 100 of the present invention which includes a flow control register 110 for altering the process flow of the operations and sub-operations carried out by the system's internal state machine 20. It is noted that FIG. 3 is meant to be suggestive of the connections between flow control register 110, its associated circuitry 112 and the rest of the memory system, and that not all interconnections are shown.

Although the invention will be described with reference to a flash memory system, it is important to recognize that the present invention can be implemented as part of other types of memory systems. It is only necessary that the memory system in question be one whose operations and sub-operations are controlled by a state machine, where the order in which the state machine carries out the operations and sub-operations can be altered by the use of appropriate commands or input signals.

Figure 1:
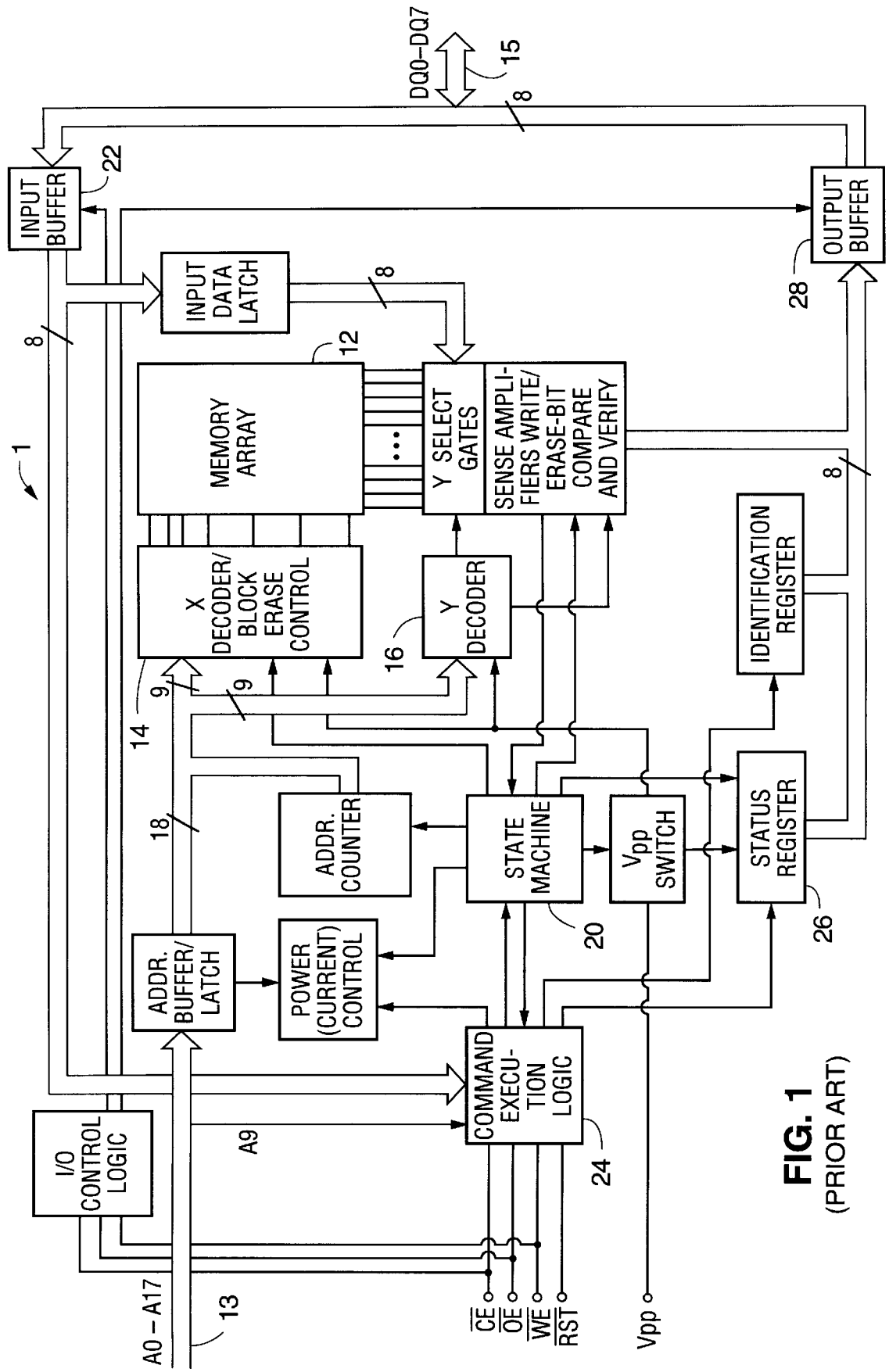
FIG. 1 is a functional block diagram of a conventional flash memory system.

As with the memory system of FIG. 1, the core of memory system 100 is an array 12 of flash memory cells. The individual memory cells (not shown) are accessed by using an eighteen bit address A0–A17, which is input by means of address pins 13. Nine of the eighteen address bits are used by X decoder 14 to select the row of array 12 in which a desired memory cell is located and the remaining nine bits are used by Y decoder 16 to select the appropriate column of array 12 in which the desired cell is located.

Memory system 100 contains internal state machine (ISM) 20 which controls the data processing operations and sub-operations performed on memory system 100, such as the steps necessary for carrying out programming, reading and erasing operations on the memory cells of array 12. Internal state machine 20 is typically implemented in the form of a set of logic gates whose inputs determine which operations and sub-operations of the memory system are carried out, and in what order those operations occur. The specific architecture of internal state machine 20 is not critical to the present invention, which does not depend upon the form of the state machine.

Memory system commands are issued on I/O pins 15, and are then transferred to data input buffer 22 and then to command execution logic unit 24. Command execution logic unit 24 receives and interprets the commands which are used to instruct state machine 20 to perform the steps required for erasing array 12 or carrying out another desired operation. Once an operation is completed, state machine 20 updates 8 bit status register 26. The contents of status register 26 is transferred to data output buffer 28, which makes the contents available on data I/O pins 15 of memory system 100. Status register 26 permits an external processor to monitor certain aspects of the status of state machine 20 during memory array write and erase operations. The external processor periodically polls data I/O pins 15 to read the contents of status register 26 in order to determine whether an erase sequence (or other operation) has been completed and whether the operation was successful.

In accordance with the present invention, memory system 100 includes a test mode detector and decoder 102 used for entry to a test mode of operation in which the contents of flow control register 110 may be read or altered. Details of the implementation of the detector/decoder 102 will be described later. Memory system 100 is capable of operating in a normal mode of operation and an alternative or test mode of operation. In the normal mode of operation, an end user can carry out normal memory functions including programming, erasing and reading of the memory cells. The alternative or test mode of operation is used for carrying out various memory functions other than the normal functions and is a mode not intended to be accessed by end users. Detector/decoder 102 detects certain test inputs to the memory and switches the memory to a selected test mode. One of these test modes permits the data or control parameters stored in flow control register 110 to be altered as desired.

Figure 2:
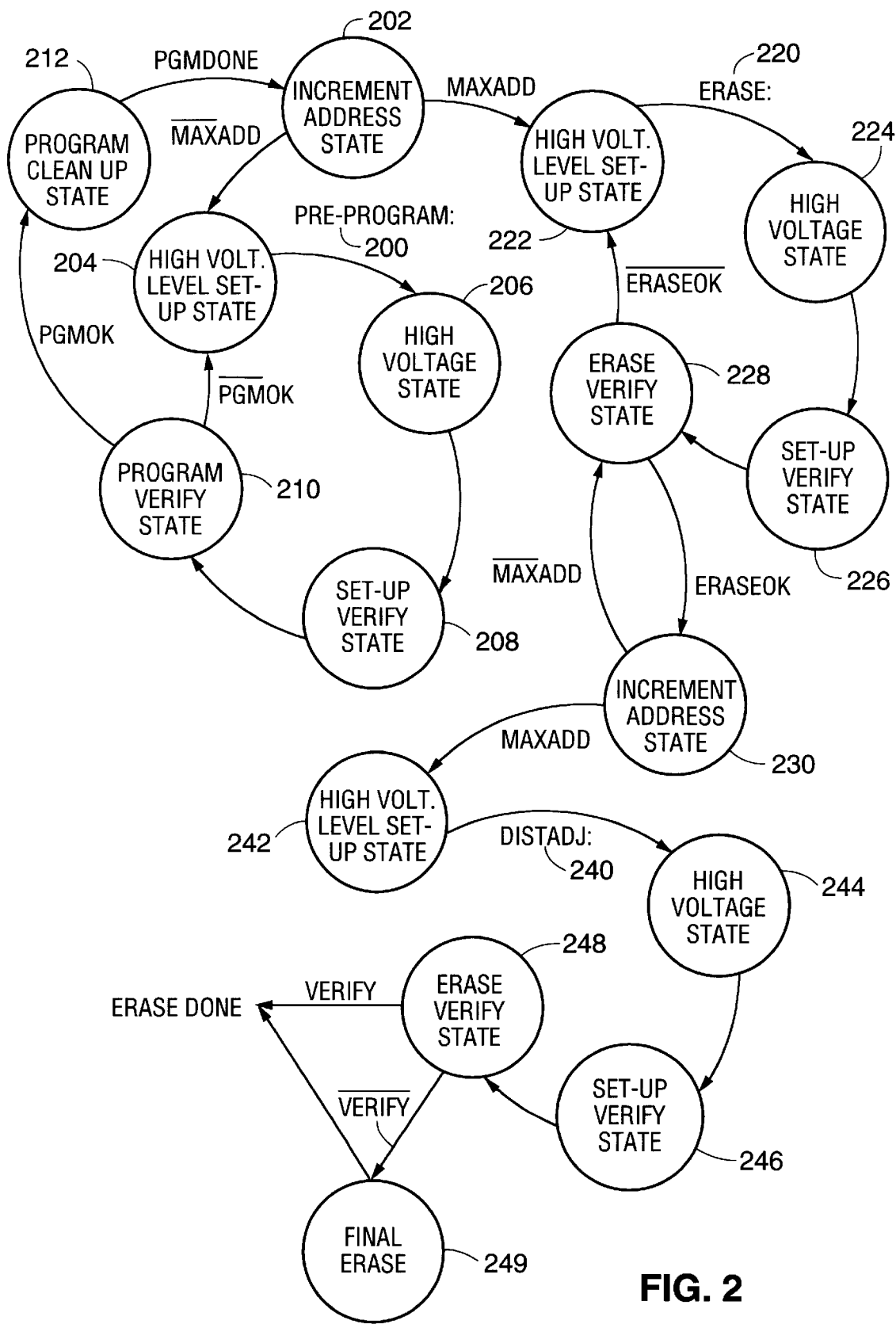
FIG. 2 is a state diagram showing the process flow of a typical memory system of the type shown in FIG. 1 during the pre-programming, erase, and distribution adjustment stages which occur in a complete erase operation.

As noted, memory system 100 of the present invention includes flow control register 110 which contains data used to alter the process flow of the memory system. This is accomplished by instructing internal state machine 20 to include or bypass certain operations or sub-operations. Individual bits within register 110 are used to control the operations and sub-operations carried out under control of internal state machine 20. For example, by setting a bit of the register, the flow may be modified to include or bypass the pre-program stage (step 200 of FIG. 2) of the complete erase operation.

FIG. 4 is a diagram showing the contents of an embodiment of the flow control register of the present invention. As shown in FIG. 4, flow control register 110 is implemented as an 8 bit storage medium. Flow control register 110 may be implemented in the form of a volatile or a non-volatile storage medium, or a combination of the two. If implemented as a volatile medium, register 110 must be re-programmed each time the system is powered up. This can be accomplished by means of flow control register circuitry 112. Flow control register 110 may also be implemented in the form of a storage medium having a volatile and a non-volatile portion. In this case, register 110 would contain non-volatile memory elements which were programmed by circuitry 112 to values corresponding to the desired bit values of the flow control register. When power is applied to the memory system, the contents of the non-volatile portion of the flow control register would be copied to the volatile portion of the flow control register. This section would then control the operation of the state machine.

The value of each bit of flow control register 110 corresponds to an instruction to the internal state machine to include or bypass the indicated operation or sub-operation, i.e., skip program verify, erase verify, etc. Depending on the value of the bits, the indicated stage in the process flow of the memory system is either implemented or bypassed. Combinations of bits (multiple bits) may also be used to instruct the internal state machine to include or bypass certain operations or sub-operations. It is noted that a memory system designer can place as many bits as necessary in register 110 to create as much flexibility in modifying the operation of the memory system as is desired. It is well known to those skilled in the art how to construct a logic circuit which uses the value of the indicated bit(s) of flow control register 110 to alter the operations and sub-operations carried out by an internal state machine.

Figure 5:
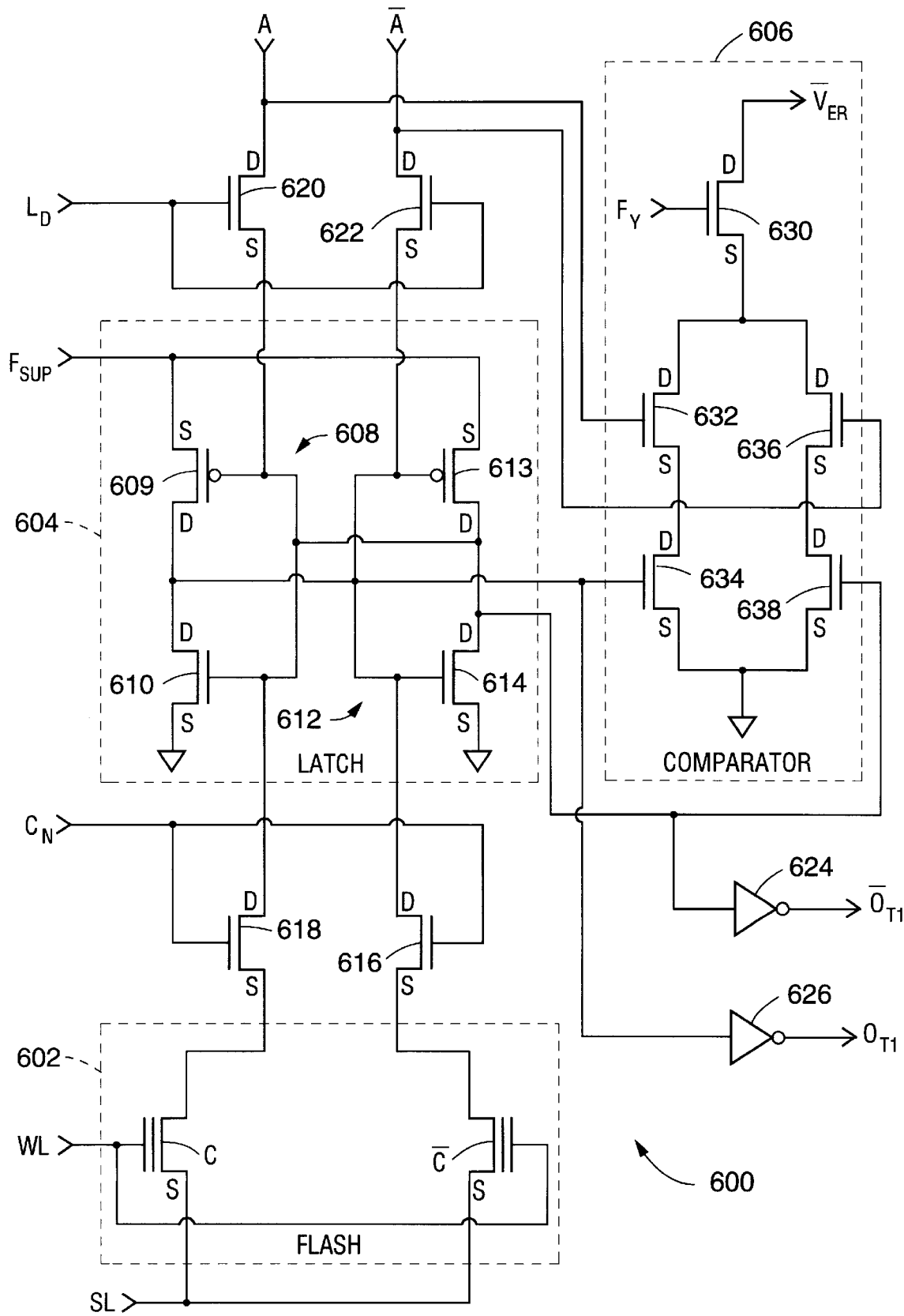
FIG. 5 is a schematic diagram of an embodiment of one of a group of storage mediums which comprise the flow control register of the present invention.

FIG. 5 is a schematic diagram of an embodiment of one of a group of data storage mediums which comprise flow control register 110 of the present invention. Each storage medium of flow control register 110 is depicted as a non-volatile data storage unit 600 having a data input and a volatile memory device 604 for storing data. Typically, volatile memory device 604 is a latch circuit comprising a pair of cross-coupled inverter circuits which store the data in complementary form. Data storage unit 600 further includes a non-volatile memory device 602 such as a pair of flash memory cells which also store data in complementary form.

Control means is provided for controlling the operation of the data storage unit. The control means includes load means for transferring data from the data input to volatile memory device 604. Typically, the load means includes a pair of transistors coupled between the data inputs and the latch circuit which force the latch circuit to a state determined by the input data.

The control means further includes program means for programming non-volatile memory device 602 with the data stored in volatile memory device 604. In the event non-volatile memory device 602 is implemented by a pair of flash memory cells, the current for programming the cells is preferably provided by output transistors of volatile memory device 604.

Data storage unit 600 is capable of storing a single bit of parameter data. Multiple bits can be stored by simply providing a separate storage unit for each bit. As noted, storage unit 600 includes non-volatile memory or Flash section 602, volatile Latch section 604 and Comparator section 606. The flash section includes a pair of flash memory cells C and $\overline{C}$ for storing one bit of parameter data in complementary form. As is well known, a flash cell utilizes a floating gate transistor having a drain, source, floating gate and control gate. Data is stored in the cell by adding or removing charge from the floating gate. Erasure is accomplished by removing charge by way of Fowler-Nordheim tunneling from the floating gate through a thin gate oxide disposed intermediate the floating gate and the cell channel. The flash cells have their common source regions connected to a common source line which receives signal $S_L$ and their control gates connected to a common word line which receives signal $W_L$.

Latch section 604 includes a pair of cross-coupled inverters which form a latch circuit. A first inverter 608 includes a P channel transistor 609 connected in series with an N channel transistor 610. The common drain connections of transistors 609 and 610 form the output of the inverter and the common gate connection forms the input. The second inverter 612 includes a P channel transistor 613 connected in series with an N channel transistor 614. The common drain connection of transistors 613 and 614 form the output of second inverter 612 and the common gate connection forms the input.

As previously noted, the two inverters of Latch section 604 are connected to form a latch circuit. In particular, the output of first inverter 608, the common drain connection of transistors 609 and 610, is connected to the input of second inverter 612, the common gate connection of transistors 613 and 614. The output of second inverter 612, the common drain connection of transistors 613 and 614, is connected back to the input of first inverter 608, the gates of transistors 609 and 610.

The output of first inverter 608 of Latch section 604 is connected to the drain of flash cell $\overline{C}$ by way of N channel transistor 616 and the output of second inverter 612 is connected to the drain of flash cell C by way of N channel transistor 618. The gates of the two connect transistors 618 and 616 are connected to a common control line which carries signal $C_N$.

Latch section 604 is powered by applying a voltage $F_{SUP}$ to the sources of transistors 609 and 613. As will be explained, the magnitude of the voltage $F_{SUP}$ can be controlled by conventional circuitry, the details of which are not described since they are conventional and form no part of the present invention.

Data to be loaded into Latch section 604 is provided in complementary form A and $\overline{A}$ by way of N channel transistors 620 and 622. The common gates of transistors 620 and 622 are connected to a line which receives a load signal $L_D$. Transistor 620 functions to couple data input A to the input of first inverter 608 of Latch section 604, and transistor 622 functions to couple data input $\overline{A}$ to the input of second inverter 612.

The two complementary outputs of Latch section 604 are coupled to respective inverters 624 and 626. The outputs of inverters 624 and 626 form the complementary outputs $O_{T1}$ and $O_{T1}$ of the subject data storage unit 600. The outputs of Latch section 604 are also coupled to respective inputs of comparator circuit 606. The data inputs A and $\overline{A}$ are also coupled to respective inputs of comparator circuit 606. As will be explained, comparator circuit 606 functions to compare the data stored in Latch section 604 with the data inputs A and $\overline{A}$ so that the state of the latch circuit can be verified. Typically, the output of comparator circuit 606, signal $\overline{V}_{ER}$ is wire ORed to comparator sections associated with other data storage units, so that a single verification signal $\overline{V}_{ER}$ can be used to indicate whether there is a match between the contents of Latch section 604 and the associated data inputs A and $\overline{A}$ among several of the subject data storage units shown in the figure.

Comparator section 606 includes five N channel transistors 630, 632, 634, 636 and 638. Transistor 630 is coupled between the comparator output $\overline{V}_{ER}$ and the common drain connection of transistors 632 and 636. In addition, the gate of transistor 630 is connected to receive signal $F_V$ which is active when the state of Comparator section 606 is to be sampled. Transistors 632 and 634 are connected in series, with the gate of transistor 632 connected to receive data input A and the gate of transistor 634 connected to receive the output of first inverter 608 of Latch section 604. Similarly, transistors 636 and 638 are connected in series, with the gate of transistor 636 connected to receive data input $\overline{A}$ and the gate of transistor 638 connected to receive the output of the second inverter 612 of Latch section 604. As will be explained, when the complementary data inputs A and $\overline{A}$ match the complementary outputs of the two Latch section inverters, the output of the comparator circuit 606, $\overline{V}_{ER}$ will be high, otherwise the output will be low.

There are a total of five operations which the data storage unit 600 of FIG. 5 can perform, including Load, Erase, Program, Recall and Verify. These operations will be described in connection with FIG. 6, which is a timing diagram illustrating the operating modes of the flow control register of the present invention, together with the schematic diagram of FIG. 5. As will be explained in greater detail, the flash cell C and $\overline{C}$ are programmed by first loading the programming data into Latch section 604. In addition, the flash cells C and $\overline{C}$ are read by transferring the contents of the flash cells to Latch section 604.

Load The function of the Load cycle is to set Latch section 604 to a known state based upon the complementary input data A and $\overline{A}$. The Load operation is required prior to the Program operation to ensure that Latch circuit 604 is at the desired state.

Figure 6:
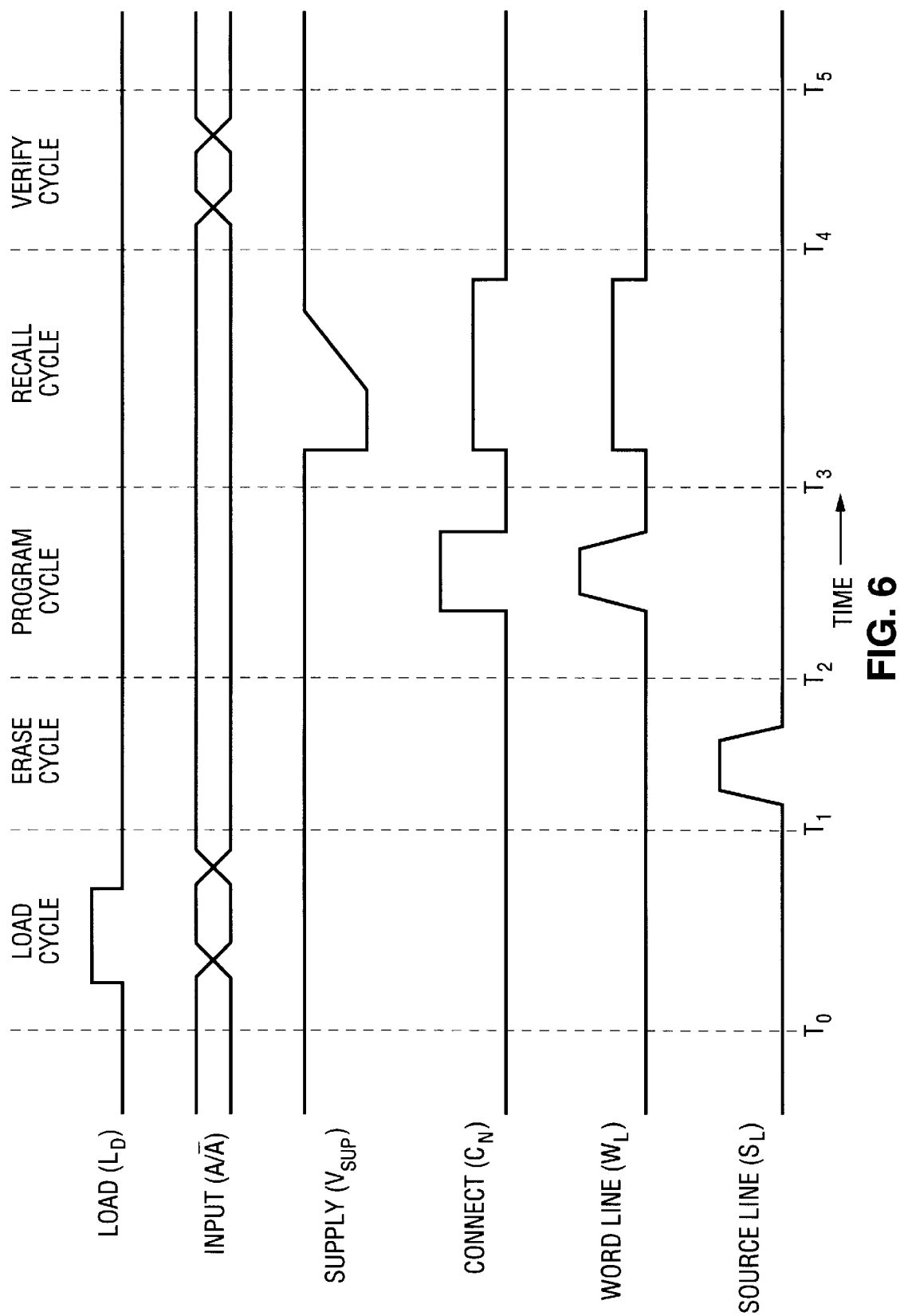
FIG. 6 is a timing diagram illustrating the operating modes of the flow control register of the present invention.

The beginning of the Load cycle is indicated by time $T_0$ (see FIG. 6). Following time $T_0$, the input data A and $\overline{A}$ is applied to the drains of transistors 620 and 622. Once the input data are stabilized, the load signal $L_D$ is made active thereby turning on transistors 620 and 622. In addition, Latch section 604 supply voltage $F_{SUP}$ is maintained at its nominal primary supply voltage $V_{CC}$ level of +5 volts. Assuming, for example, that A is a high level, the input of the first inverter 608, the common gates of transistors 609 and 610 will be pulled up to a high level. At the same time, complementary signal $\overline{A}$ will be at a low level and will tend to pull the input of the second inverter 612, the gates of transistors 613 and 614, down to a low level by way of load transistor 622.

This combined opposing action on the inputs of the two inverters will force the output of first inverter 608 to a low state and the output of second inverter 612 to a high state. Latch section 604 will hold or store this data until it is altered by a subsequent Load operation, until it is changed by a Recall operation (as will be explained), or until the power is removed from the system. The load transistors must be of sufficient size so as to be capable of forcing Latch section 604 transistors to the desired state.

Erase The operation for erasing the flash cells C and $\overline{C}$ commences at time $T_1$. This cycle is performed directly on the cells rather than by way of Latch section 604. The connect signal $C_N$ is inactive in this operation so that both connect transistors 618 and 616 will be non-conductive. Thus, the drains of cells C and $\overline{C}$ will be left floating. In addition, signal $W_L$ connected to the word line of the two cells is grounded and the signal $S_L$ connected to the sources of the two cells is raised to a large positive voltage such as +12 volts. As is well known, under these conditions, the cells C and $\overline{C}$ will both be erased by way of Fowler-Nordheim tunneling. Flash section 602 must then be appropriately programmed so that the cells C and $\overline{C}$ will store complementary data.

Program The Programming cycle commences at time $T_2$. As previously noted, Latch circuit 604 must have been previously set to the desired programmed state of Flash section 602. Load signal $L_D$ is inactive so that transistors 620 and 622 are off. The supply voltage $F_{SUP}$ is at a nominal value of +6 volts. Assume, for example, that Latch section 604 had previously been set such that the output of inverter 608 is at a low level and the output of inverter 612 is at a high level. In that event, the drain of transistor 618 will be close to the supply voltage $F_{SUP}$ and the drain of transistor 616 will be close the circuit common.

The connect signal $C_N$ is made active (high) shortly after time $T_2$, thereby turning on transistors 618 and 616 and effectively connecting the supply voltage $V_{SUP}$ and circuit common to the drain of cells C and $\overline{C}$, respectively. The connect signal $C_N$ switches to a high level of +12 volts in the Programming cycle so that transistors 618 and 616 have a sufficient gate-source voltage to connect the supply voltage $F_{SUP}$ of +6 volts to either one of the drains of cells C and $\overline{C}$ depending upon the data stored in the latch. In this case, cell C will get the $F_{SUP}$ on its drain. At the same time, the control gates of the cells C and $\overline{C}$ are connected to word line signal $W_L$ having a magnitude equal to +12 volts. In fact, in many cases $C_N$ and $W_L$ can be the same signal. The source line signal $S_L$ is at circuit common and is connected to the common sources of cells C and $\overline{C}$. This combination of voltages applied to cell C will cause the cell to be programmed, whereas those applied to cell $\overline{C}$ will not result in programming of the cell. In order to enable the cells C and $\overline{C}$ to be programmed to opposite states, it is necessary to first erase both cells in an Erase cycle prior to performing the Programming cycle. As previously noted, Latch circuit 604 must have also been previously set in order to carry out a Programming cycle.

Transistor 613 of inverter circuit 612 will provide the programming current, which is typically 500 microamperes, to cell C. If cell $\overline{C}$ is being programmed, the programming current is provided by transistor 609 of inverter circuit 608. Thus, transistors 609 and 613 of Latch circuit 604 must be of sufficient size to be able to conduct these programming currents. As previously noted, transistors 620 and 622 must also be sized so that they have sufficient strength to force transistors 609 and 613 to a desired state during the Load cycle. Typically, the programming voltages will be applied for a relatively long duration ranging from a few hundred microseconds to a millisecond. Since the data is stored in cells C and $\overline{C}$ in complementary form and since, as will be explained, the cells will be read in a differential manner, there is a large error tolerance margin. Accordingly, it is not necessary to perform any type of program data verification as is frequently done in flash memory systems to confirm that the data has been properly programmed.

Recall The Recall cycle is illustrated in FIG. 6 beginning at time $T_3$. In this operation, the complementary states of cells C and $\overline{C}$ are transferred to Latch section 604. When power is removed from the data storage unit, the data is not retained in volatile Latch section 604. Accordingly, when power is reapplied, initialization circuitry is used to cause the transfer of the data stored in the non-volatile cells C and $\overline{C}$ to Latch section 604.

Since the flash cells C and $\overline{C}$ have a limited drive capability and would not normally have sufficient strength to force the transistors of Latch section 604 to a desired state, the supply voltage $V_{SUP}$ is momentarily dropped to a low level approaching ground potential in the initial stage of the Recall operation. In addition, the connect signal $C_N$ is made active thereby connecting Flash section 602 to Latch section 604 by way of transistors 618 and 616. The word line of cells C and $\overline{C}$ is connected to a signal $W_L$ having a magnitude equal to the primary supply voltage $V_{CC}$ of typically +5 volts. Again, signals $W_L$ and $C_N$ can be the same signal for this operation.

The Recall cycle is preferably initiated by some form of power-on-reset circuit which will cause the Recall cycle to be performed at power on and when the primary supply voltage $V_{CC}$ drops to some predetermined level which would possibly affect the state of Latch circuit 604. The Recall cycle is initiated by the power-on-reset circuit when the circuit has detected that the primary supply voltage $V_{CC}$ has ramped up to about +3 volts after initial power on or has ramped up to about +3 volts after a drop in voltage $V_{CC}$ below that level.

During the Recall cycle, the common source line signal $S_L$ is also set to ground potential. Assuming that cell C has been programmed and cell $\overline{C}$ is in an erased state, cell C will be non-conductive so that the input of inverter 608 of Latch section 604 will not be affected. Cell $\overline{C}$ will be conductive and tend to pull the input of inverter 612 of Latch section 604 down to ground potential.

Since Latch section 604 is not powered at this point, cell $\overline{C}$ is capable of pulling the input of inverter 612 down to a low level despite the limited drive capability of the cells. As can be seen from the timing diagram of FIG. 6, voltage $V_{SUP}$ is held to a low value momentarily and then is increased to the normal operating level. Preferably, the voltage is increased at a slow rate.

As the supply voltage $V_{SUP}$ increases, the cell $\overline{C}$ will continue to hold the input of inverter 612 at a low level so that P channel transistor 613 will proceed to turn on. This will cause the output of inverter 612 to be high which will, in turn, cause the input of inverter 608 to also be high. Thus, transistor 610 of inverter 608 will also begin to turn on thereby causing the output of inverter 608 to go low thereby reinforcing cell $\overline{C}$ in pulling down the input of inverter 612. Eventually, the supply voltage $V_{SUP}$ will be at the normal high voltage of $V_{CC}$ or typically +5 volts and Latch circuit 604 will be in the desired state of indicating the state of Flash section 602.

Even though cell $\overline{C}$ has a very small drive capability, by controlling the supply voltage $V_{SUP}$ as described, the cell is capable of forcing Latch section 604 to the desired state. Programmed cell C will not have much, if any, tendency to pull the input of inverter 608 down and thus will not oppose the action of cell $\overline{C}$. However, even if the programmed threshold voltage of cell C approached the erased threshold voltage of cell $\overline{C}$, it can be seen that the cell with the largest cell current will still be able to control the state of Latch circuit 604. This differential action enhances the reliability of the operation of the subject data storage unit. Note also that the outputs of inverters 608 and 612 are coupled to respective inverters 624 and 626 so that loading on the Latch section outputs will be equal. The Latch section will thus remain capacitively balanced so as to enhance the ability of the flash cells C and $\overline{C}$ to force the Latch section to any desired state.

Verify As previously explained, the Verify cycle is used to determine the state of Latch section 604. This operation can also be used to determine the state of Flash section 602 if it is preceded by a Recall cycle. The Verify cycle utilizes the complementary data inputs A and $\overline{A}$ and compares them with the state of Latch section 604. Comparator section 606 functions essentially as an exclusive NOR circuit and provides a logic low output $\overline{V}_{ER}$ in the event there is a match between Latch section 604 and the data input A and $\overline{A}$.

By way of example, assume that a Verify cycle is to take place so that the verify signal $F_V$ is made active. This will cause transistor 630 of Comparator section 606 to be conductive. Further assume that data input A is a logic "1" (high) so that $\overline{A}$ is a logic "0" (low). Further assume that inverter 608 output of Latch section 604 is a logic "0" so that the inverter 612 output will be a logic "1". Since input A is high and since the output of inverter 608 is low, transistor 632 of Comparator 606 section will be conductive and transistor 634 will be off. Similarly, since input $\overline{A}$ is low and the output of inverter 612 is high, transistor 636 will be off and transistor 638 will be on. There is a pull-up device (not depicted) connected between the output of Comparator section 606 and voltage $V_{CC}$. As a result of transistors 634 and 636 being off, there will be no conductive path between the source of transistor 630 and the circuit common. Accordingly, the output $\overline{V}_{ER}$ will remain in a high state ("1") indicating a valid compare.

If the outputs of inverters 608 and 612 are logic "1" and "0", respectively, and the data inputs A and $\overline{A}$ remain the same, transistors 632 and 634 will both be conductive. Thus, when transistor 630 is turned on by signal $F_V$, the output $V_{ER}$ will be pulled down to a logic "0" indicating a no compare condition.

In the event the data inputs A and $\overline{A}$ are a logic "0" and "1", respectively, and the outputs of inverters 608 and 612 are a logic "1" and "0", respectively, transistors 632 and 638 will be off. Thus, signal $V_{ER}$ will be a logic "1" thereby indicating a valid compare. Continuing, if inputs A and $\overline{A}$ were a logic "0" and "1", respectively and inverters 608 and 612 were a logic "0" and "1", respectively, transistors 636 and 638 will be conductive so that signal $\overline{V}_{ER}$ will be at a logic "0", thereby indicating a no compare.

Further details of the method of implementing flow control register 110 can be found in U.S. patent application Ser. No. 08/508,864 entitled, "NON-VOLATILE DATA STORAGE UNIT AND METHOD OF CONTROLLING SAME", filed Jul. 28, 1995, the disclosure of which is hereby incorporated in full by reference.

Figure 7:
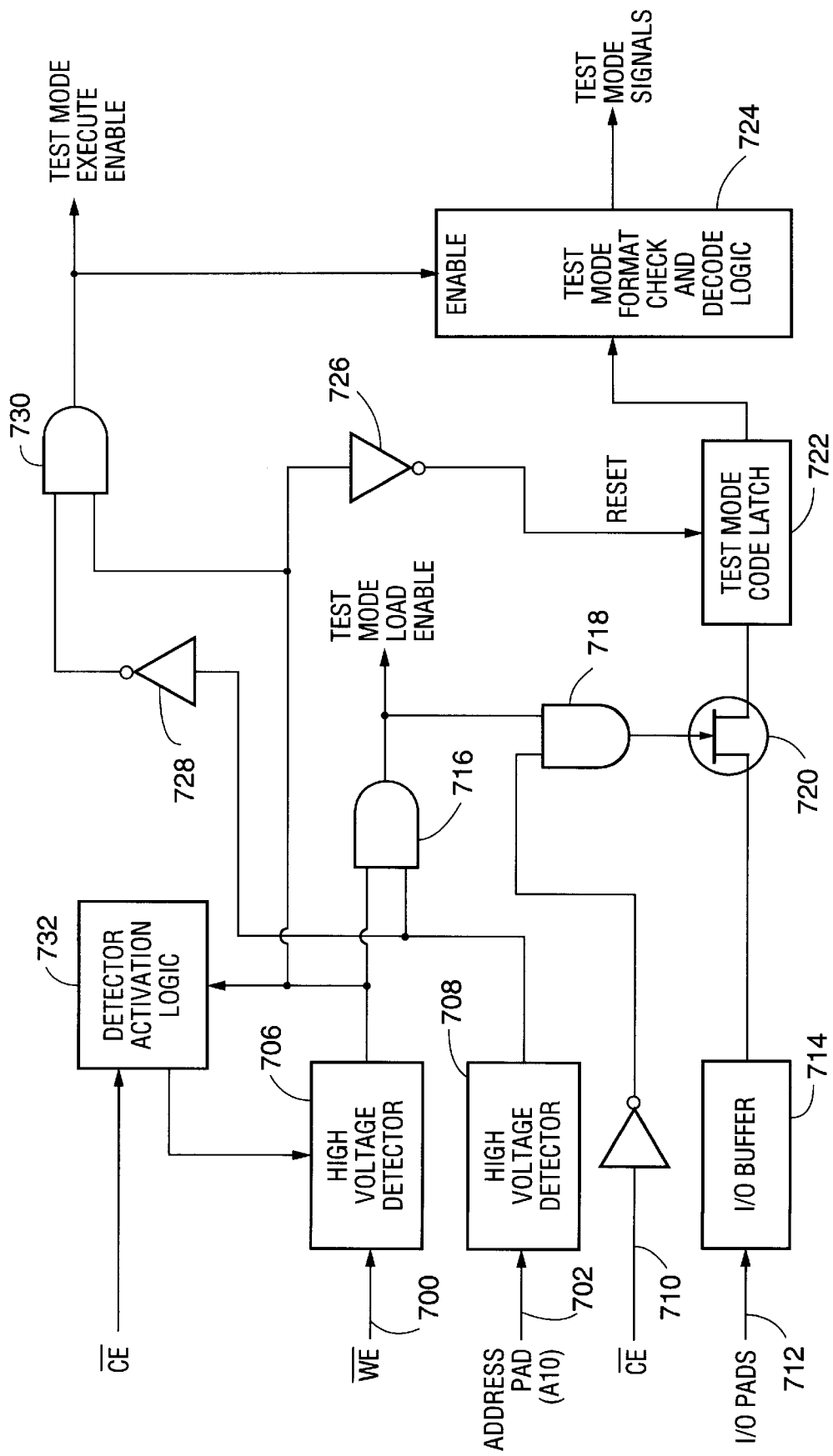
FIG. 7 is a schematic of a circuit for a detector/decoder which is used for entering the test mode of operation in order to read the contents of or write to the flow control register of the present invention.

FIG. 7 is a schematic of a circuit for detector/decoder 102 which is used for entering the test mode of operation in order to read the contents of or write to the flow control register 110 of the present invention. As noted, detector/decoder 102 is used for switching the memory system to a selected test mode of operation so that flow control register 110 can be read or altered. In order to switch the memory system to a test mode of operation, test mode commands must be applied to the data I/O terminals of the memory to indicate which one of various test modes is to be entered. One of the test modes is specifically directed to the flow control register 110 and is used for modifying the contents of the register.

Typically, the end user of the memory system would have no reason to cause the memory system to enter the test mode since this mode is intended to be used by the memory fabrication facility. Furthermore, accidental entry into the test mode is to be avoided since the memory could be rendered permanently inoperable in this mode. Thus, the test mode circuitry is designed to reduce the likelihood of accidental entry into the test mode by requiring simultaneous application of high voltages to multiple memory system terminals.

The circuit of FIG. 7 is activated by application of a high voltage to two or more terminals 700 and 702 of the memory system from an external source. These terminals are non-dedicated terminals used during normal memory operations. Terminals 700 and 702 may include, for example, address terminal (pad) A10 and the write enable terminal $\overline{WE}$. The magnitude of the high voltage applied to terminals 700 and 702 is chosen to be outside of the range of voltages which would typically be applied to those terminals during use of the terminals in normal (non-test mode) operation of the memory system. This is done to prevent an end user from unintentionally entering the test mode. The high voltage applied to terminals 700 and 702 is detected by detectors 706 and 708. A detector circuit suited for use in constructing detectors 104 and 106 is described in U.S. patent application Ser. No. 08/493,167, entitled, "Integrated Circuit Having High Voltage Detection Circuit", filed Jun. 21, 1995, the disclosure of which is hereby incorporated in full by reference.

After application of the high voltage to terminals 700 and 702, a signal on another terminal 710, in this case the chip enable $\overline{CE}$ terminal, is made active (low). Test code data corresponding to one of several possible test modes is placed on the data I/O terminals 712 of the memory and forwarded to an I/O buffer 714.

An AND gate 716 provides an test mode load enable signal when the outputs of both high voltage detectors 706 and 708 indicate that a high voltage is being applied to the two terminals 700 and 702. The load enable signal is coupled to one input of an AND gate 718 together with an inverted signal $\overline{CE}$. This causes AND gate 718 to turn on pass transistor 720 which will forward the test code data to buffer 714 and then to a test mode code latch 722. Separate I/O terminals and pass transistors 720 are used for each bit of input test mode data so that the data will be loaded into latch 722 in parallel. Typically there are a total of eight bits of test code data so that latch 722 will contain eight bits. Signal $\overline{CE}$ is then brought back to a high state thereby latching the test code data in latch 722.

After latch 722 has been loaded with the test code data, one of high input voltages, such as the input to address A10 terminal 702 is removed so that the output of detector 708 will go low thereby providing a high input to an AND gate 730 by way of inverter 728. Since the remaining input of gate 730, the output of the second high voltage detector 706, will still be high, gate 730 will produce a test mode enable signal. Among other things, this will enable a Test Mode and Format Check and Decode Logic unit 724 which will verify that the data in latch 722 corresponds to one of various proper test modes. In addition, unit 724 will decode the test mode code to determine which one of approximately fifteen different memory test modes has been entered. These test modes each have an associated test mode signal which is produced by the Test Mode and Format Check and Decode Logic unit 724 and which is used by the memory system in combination with other signals for carrying out the various test mode functions.

The system will remain in the selected test mode as long as the voltage applied to terminal 700 remains high. When signal $\overline{CE}$ is brought back to a high state, detector activation logic 732 keeps detector circuits 704 and 706 enabled as long as the voltage applied to terminal 700 remains high. During the course of carrying out the various test modes operations, it may be necessary to periodically change the state of the chip enable $\overline{CE}$ signal. However, since address A10 on line 702 has been shifted to a low state, the low output of AND gate 718 will prevent any change in the contents of the test mode code latch. Once the test mode operation is completed, the high voltage applied to terminal 700 is removed, thereby causing the output of AND gate 730 to go low and end the test mode operation.

The test mode codes loaded into latch 722 are preferably of a specific format thereby further reducing the possibility of accidental entry into a test mode. The test mode code is typically divided into two groups of bits, with the first group of bits, the format bits, signifying a test mode operation and the remaining bits signifying a particular one of the test modes.

A description of a test code format suited for use with the present invention can be found in U.S. Pat. No. 5,526,364, entitled, Apparatus for Entering and Executing Test Mode Operations for Memory, issued Jun. 11, 1996, the disclosure of which is hereby incorporated in full by reference.

Figure 8:
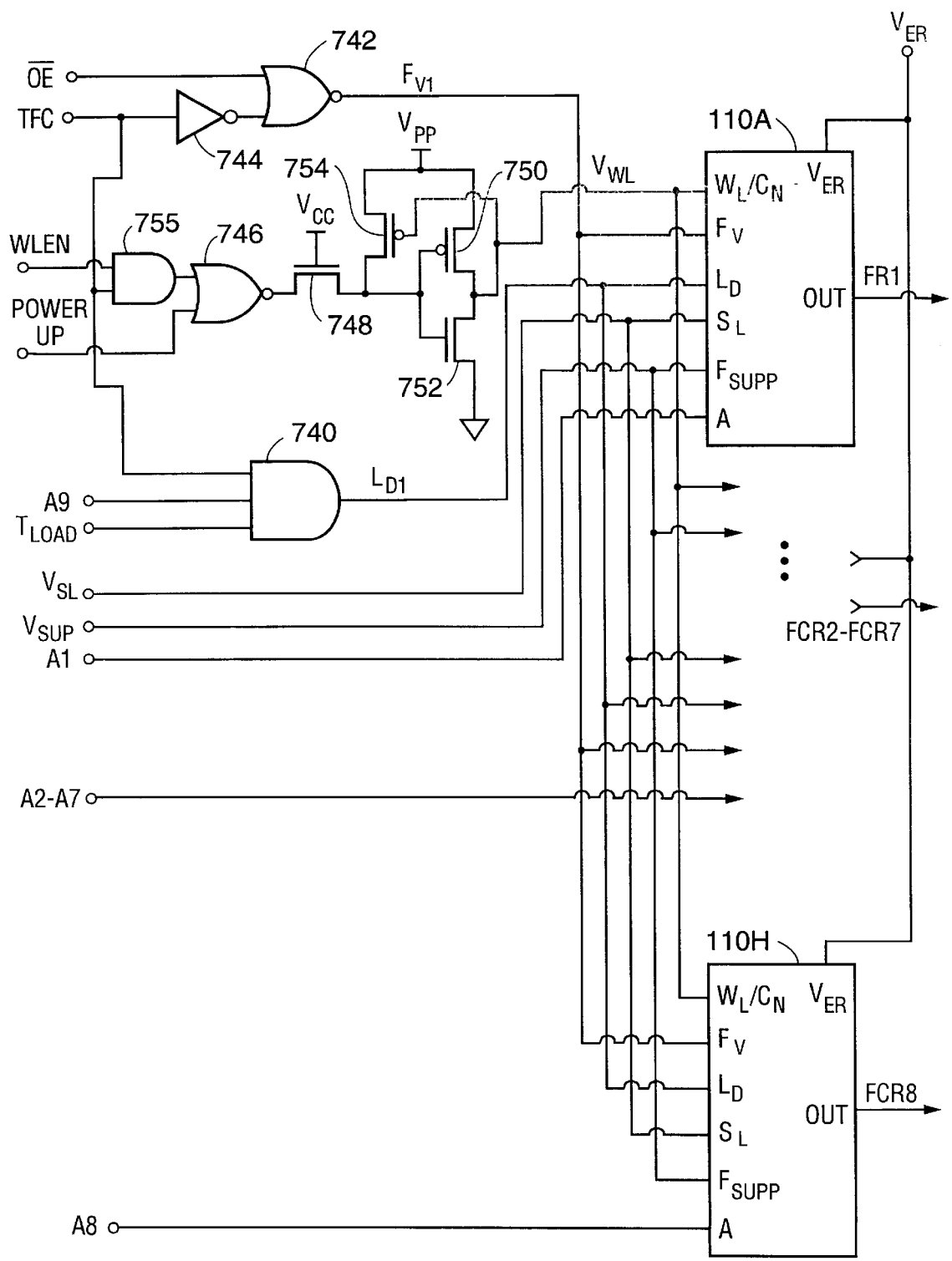
FIG. 8 is a schematic diagram of the flow control register of the present invention and associated circuitry for controlling the contents of the register.

FIG. 8 is a schematic diagram of flow control register 110 and associated circuitry 112 for controlling the contents of the register. Register 110 includes a total of eight data storage units 110A–110H, with only two of the registers being depicted in the drawings. It is noted that the construction and operation of the individual data storage units was previously described in connection with FIGS. 5 and 6.

Figure 9:
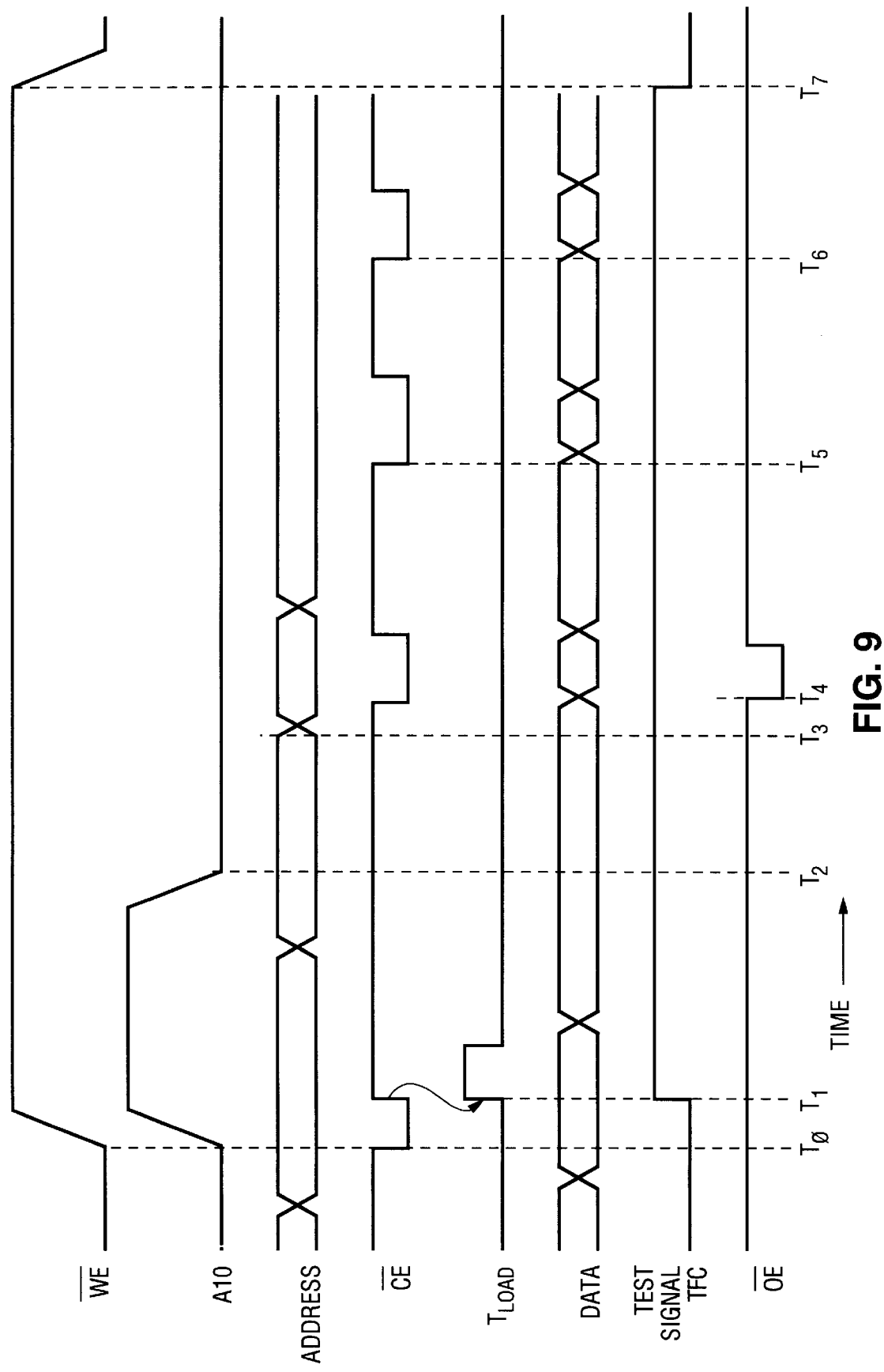
FIG. 9 is a timing diagram showing the principal signals which are generated in executing the data processing cycles of the flow control register of the present invention.

As described, the data storage units are capable of performing a Loading, Erasing, Programming, Recall and Verify cycle. FIG. 9 is a timing diagram showing the principal signals which are generated in executing some of these data processing cycles. As will be explained, the Recall cycle is automatically initiated at power on and when the memory voltage drops to a low level and does not, therefore, require entry into a test mode. Signal $\overline{RST}$ can be used to trigger the power on circuit for initiating a recall cycle.

The first step is to place the memory system 100 into the appropriate test mode. As previously described in connection with FIG. 7, the voltages on terminal $\overline{WE}$ and address terminal A10 are both brought to +12 volts at initial time $T_0$, as can be seen in the timing diagram of FIG. 9. In addition, the data I/O terminals are provided with data which corresponds to the desired test mode, which in the present example, is the Flow Control Register test mode. This is the test mode data which will be entered into test mode code latch 722 of FIG. 7.

When the memory system is placed in the test mode, the terminals of the system used for normal memory operations including the data terminals and the address terminals are used for carrying out the various test mode functions. The particular use of these non-dedicated terminals in a test mode is determined by the particular test mode. In the Flow Control Register Test mode, address terminals A1–A8 are connected to the data inputs A of the respective data storage units 110A–110H (input $\overline{A}$ is not depicted) which make up flow control register 110. Another address terminal, A9, is used as an enable terminal and will function to inhibit certain operations on the flow control register unless it is brought to a high ("1") state.

In order to write data to (program) flow control register 110, it is first necessary to load the data to be programmed into the latch section of the data storage units. Thus, the Load cycle will first be described. At or prior to time $T_0$ (see FIG. 9), the address terminals A1–A8 will have been set with the data to be loaded into flow control register 110. It is necessary to provide data for all eight stages (storage units) since the storage units are not individually accessible. In addition, the associated enable address A9 must be set to a "1".

Also, at time $T_0$, signal $\overline{CE}$ is momentarily brought low and returned to the inactive or high state at time $T_1$. This will cause the test mode data to be transferred to the test mode code latch 722 (see FIG. 7). State machine 20 (see FIG. 3) is implemented in a manner so as to produce a signal $T_{LOAD}$ at this time in response to the rising edge of $\overline{CE}$, provided that the voltages applied to terminals $\overline{WE}$ and A10 are at a high voltage, which is the case. In addition, test mode format check and decode logic 724 (see FIG. 7) will produce a decode output test signal TFC indicating the Flow Control Register test mode.

Referring to FIG. 8, an AND gate 740 has one input connected to receive test signal TFC, a second input connected to receive the enable address A9, and a third connected to receive the $T_{LOAD}$ signal. Thus, when all three of these signals are high at time $T_1$, the output of gate 740 will go high thereby causing the load inputs LD of the eight data storage units 110A–110H to go high. This will cause the data present on the eight address inputs A1–A8 connected to the data inputs A ($\overline{A}$ is not depicted) of the data storage units to be transferred to the latch section 604 of the data storage units previously described in connection with FIGS. 5 and 6.

A user can also verify the contents of the volatile latch section 604 of all eight data storage units 110A–110H. As previously described in connection with the operation of the data storage units 600 (see FIG. 5), each unit has an internal comparator 606 for comparing the contents of the latch section 604 with the data A and $\overline{A}$ appearing at the input of the storage unit. If there is a match, signal $V_{ER}$ remains high. If there is no match, signal $V_{ER}$ is pulled low. All of the data storage units verify outputs are wire ORed together so that any "no match" of those storage units being verified will produce a low signal $V_{ER}$. Since the memory system is in a test mode of operation, the low $V_{ER}$ signal is made available on one of the data I/O pins of the memory at the end of a verify cycle. A further description of how internal system signals may be accessed when in a test mode of operation can be found in the U.S. Pat. No. 5,619,461, entitled "Memory System Having Internal State Monitoring Circuit", issued Apr. 8, 1997, the disclosure of which is hereby incorporated in full by reference.

In a typical verify operation, the status of the storage units 600 is periodically tested by placing a first set of test data on the appropriate address terminals and performing a verify cycle. Since it is not possible to directly identify which particular one of storage units is a "no match", the input data is changed and the verify cycle is repeated. This will continue until one particular set of input data applied to the address terminals results in a match (high $V_{ER}$ signal)

Thus, a first set of test data is applied to address terminals A1–A8. This occurs around time $T_3$. That data, which may initially be all "0"s, is applied to the data input A of the eight data storage units 110A–110H. The chip enable signal $\overline{CE}$ is made to go active as it is for all testing operations so that the various memory system elements are enabled. Note that the active signal $\overline{CE}$ will not change the test mode code data in latch 722 of FIG. 7 due to the fact that terminal A10 is no longer at high voltage at time $T_3$. In addition, the output enable signal $\overline{OE}$ is made active so that, among other things, the bit corresponding to signal $V_{ER}$ can be read out on one of the data I/O terminals of the memory system.

NOR gate 742 of FIG. 8 receives the inverted test signal TFC by way of inverter 744. Gate 742 further receives signal $\overline{OE}$ so that the output of gate 742, signal $F_{V1}$, will be high. Thus, all eight comparator circuits of data storage units 110A–110H will compare the content of their respective latch sections 604 with the corresponding input data A on the associated address terminals.

If there is a no compare at any of the storage units, signal $V_{ER}$ will be low on one of the data I/O terminals at time $T_4$. In that event, the input data on the address terminals will be changed, typically by incrementing the binary value, and the test will be repeated. Conceivably, it may be necessary to repeat this procedure 256 times ($2^8$) to achieve a valid compare.

As previously described, the recall cycle functions to transfer the non-volatile data stored in the flash section 602 of FIG. 5 to the volatile latch section 604. Since the volatile section data will be lost when power is removed from the memory system, or when power is disturbed, a recall cycle is automatically initiated when these events are detected. As shown in the timing diagram of FIG. 6, a recall cycle is performed by grounding the source line $S_L$ of the data storage unit and applying a connect signal $C_N$ and a word line signal $W_L$. In addition, the power supply $F_{SUP}$ to the latch section 604 is momentarily grounded to enable the latch section to be set to the state of the flash section 602 as $F_{SUP}$ is returned to the normal high value.

The circuit for generating the signal $V_{WL}$ applied to the combined word line and connect inputs $W_L/C_N$ of each of the data storage units during the recall cycle and during the program cycle is shown in FIG. 8. A NOR gate 746 receives a Power Up signal at power on and when the power has been disturbed. This causes gate 746 output to go low thereby pulling the input of an inverter circuit low by way of an N channel pass transistor 748. Transistor 748, which is always on since the gate is connected to the primary supply voltage $V_{CC}$, is part of a level shifting circuit which converts the output of gate 746 from one which switches between $V_{CC}$ (+5 volts) and ground to one which switches between $V_{PP}$ (+12 volts) and ground. P channel and N channel transistors 750 and 752, respectively, form the inverter, with the circuit output $V_{WL}$ being at the common drain connection of the two transistors. A feedback transistor 754 is included to assist gate 746 in pulling the input to the inverter to a sufficiently high level approaching $V_{PP}$ so that transistor 750 is turned off when the output of gate 746 is high. The word line input $W_L$ and the connect input $C_N$ of all of the data storage units 110A–110H are combined as a single input $W_L/C_N$ since, as previously described, the storage units are capable of operating with these inputs combined. Except during a programming cycle, signal $V_{PP}$ applied to the circuits will have a value equal to $V_{CC}$, so at power on the Power Up signal will cause signal $V_{WL}$ applied to the combined input $W_L/C_N$ of the data storage units to go to the $V_{CC}$ level. Circuitry not depicted will also control signal $V_{SUP}$ applied to inputs $F_{SUP}$ to momentarily go low so that the data in flash cells C and $\overline{C}$ will be transferred to latch section 604 thereby causing the recall cycle to be performed.

If data storage units 110A–110H of flow control register 110 are to be written to (programmed), it is first necessary to erase the units. Storage unit erasure is carried out by issuing the same type of ease commands used in normal memory system operation. However, since the memory system is in a test mode, as opposed to a normal operating mode, the erase commands will result in the erasure of the flash cells C and $\overline{C}$ rather than the flash cells of memory array 12.

No attempt is made to limit erasure to a limited number of storage units since an ease operation must be followed by a program operation. One reason for this requirement is due to the fact that the erase procedure erases both flash cells C and $\overline{C}$ to the same erased state, whereas storage unit operation requires that the cells store data in complementary form. If a particular storage unit is to be left in its original state, the original data stored in flash section 602 prior to erasure will be the same data stored in the latch section 604. Thus, after erasure, the subsequent programming sequence will simply reprogram the flash section 602 with the same data which was just erased.

The erase operation is carried out by providing the memory with a pair of erase commands. The commands are provided to the memory by placing the a first erase command (20H) on the data I/O lines at time $T_5$. In addition, signal $\overline{CE}$ is made active (low). This will be followed by a second erase command (D0H) at time $T_6$ which is accompanied by an active signal $\overline{CE}$. These two standard erase commands are forwarded to the Command Execution Logic 24 (see FIG. 3) for processing similar to that of normal erase commands. Circuitry in the memory for generating the positive voltage applied to the source lines of the memory array 12 during an erase operation will, instead, produce the same voltage of +12 volts in the form of signal $V_{SL}$. Signal $V_{SL}$ will then be applied to all of the source line inputs $S_L$ of all of the data storage units 600. Since input $W_L/C_N$ are at a low level, the flash cells C and $\overline{C}$ of all of the data storage units will be erased after time $T_6$.

The program cycle is initiated after entry into the Flow Control Register test mode by issuance of the same pair of commands that are used in normal memory program operations. This cycle causes data stored in the volatile latch section 604 to be transferred to the non-volatile flash section 602. Since the two sections 602 and 604 normally contain the same data, it is necessary to first perform a load cycle to load the latch section 604 with new data to be programmed into the flash section 602.

The first command (40H) for programming the flash section 602 of the eight data storage units 110A–110H is a set up command followed by a command which contains the address and data information used in normal memory operations. The second command must be issued even though the address and data applied to the memory data I/O terminals and to the address terminals will be "don't care".

In addition to illustrating erase operations at times $T_5$ and $T_6$, the FIG. 9 timing diagram can be used to illustrate program operations at the same time periods. At time $T_5$, when the memory system is in the Flow Control Register test mode, the first program command (40H) is sent using the data I/O terminals. At the same time, the chip enable signal $\overline{CE}$ is made active. This is followed by the second program command which is also accompanied by an active signal $\overline{CE}$. As part of the second command, it is necessary to force the data I/O terminals to some state even though that state is a "don't care." The second command will cause state machine 20 (see FIG. 3) to issue a word line enable signal $W_{LEN}$, which, when in the normal operating mode, will cause the data present in the data I/O terminals to be programmed at the address on the address terminals. However, in the test mode, signal $W_{LEN}$ will instead cause the contents of all of the data storage latch sections 604 to be programmed into the associated flash section 600.

As can be seen in FIG. 8, signal $W_{LEN}$ is applied to one input of an AND gate 755. The second input receives the test signal TFC indicating that the memory system is in the Flow Control Register test mode. The high output of gate 755 will cause gate 746 to be low, thereby resulting in the generation of a high (+12 volts) signal $V_{WL}$ as was discussed previously during the description of the recall cycle. The high $V_{WL}$ signal is applied to the $W_L/C_N$ inputs of all eight of the data storage units 110A–110H. In addition, the source line inputs $S_L$ are all grounded and the supply inputs $F_{SUP}$ are all at a high level. As can be seen by the timing diagram of FIG. 9, these conditions will result in the flash sections 602 being programmed with the associated latch section 604 data.

Once the test operations have been concluded, the high voltage applied to terminal $\overline{WE}$ is removed at time $T_7$, thereby causing the memory system to exit the Flow Control Register test mode as indicated by the falling edge of test signal TFC. Examples of using the flow control register of the present invention to modify and evaluate the process flow of the state machine will now be described.

Once the memory system is fabricated, if it is determined that a portion of the operations or sub-operations perform as desired, that part of the flow requires no further adjustment. If a problem or non-optimal performance occurs, the parts of the flow responsible for that behavior can be individually evaluated. Using flow register 110, every step of the flow can be skipped except the section of the process flow in question. The memory system can then be cycled to carry out the modified flow and the effects of the new process flow on the memory elements can be evaluated.

For example, the effects of the distribution tightening process can be examined by only executing that stage of the process flow and performing an evaluation of the system before and after that step. Another example is that this stage can be bypassed and the memory system cycled to determine the effects of this part of the flow on the overall cycling or endurance of the flash memory elements.

During an erase cycle, if it is determined that a single pre-programming pulse is capable of programming the memory cells sufficiently so that the cells do not become over-erased during the following high voltage erase cycles, then the pre-program verify stage can be skipped. In the case were it is determined that the distribution tightening operation has not disturbed the erased cells, the final erase step after distribution tightening could be skipped. Another example of using the flow control register of the present invention is to program the memory array, then skip every stage but the erase high voltage stage. In this example, the erase verification stage is also skipped. This setup will perform one erase pulse for each erase operation, allowing the effect of a single erase pulse on the threshold voltages of the memory cells to be evaluated.

As noted, the contents of flow control register 110 is determined by flow control register circuitry 112, which sets the bits of the register. In order to prevent a user from inadvertently modifying the operation of the state machine, circuitry 112 can only be used to modify the contents of flow control register 110 after the memory system is placed into a test mode in the manner previously described. Once the test mode is accessed, circuitry 112 is used to modify control register 110 in accordance with the procedures described in this application and in the previously referenced U.S. patent application Ser. No. 08/508,864 entitled, "NON-VOLATILE DATA STORAGE UNIT AND METHOD OF CONTROLLING SAME. Further details of a procedure for reading the contents of, or writing data to the data storage units comprising flow control register 110 can also be found in U.S. patent application Ser. No. 08/508,828, entitled, "Memory System Having Programmable Control Parameters", filed Jul. 28, 1995, the disclosure of which is hereby incorporated in full by reference. Note that if it is desired to read the contents of control register 110, that data may be routed through test signal switch 104 to output buffer 28 by means of data bus 106 (see FIG. 3), and made available to a system designer.

Figure 10A:
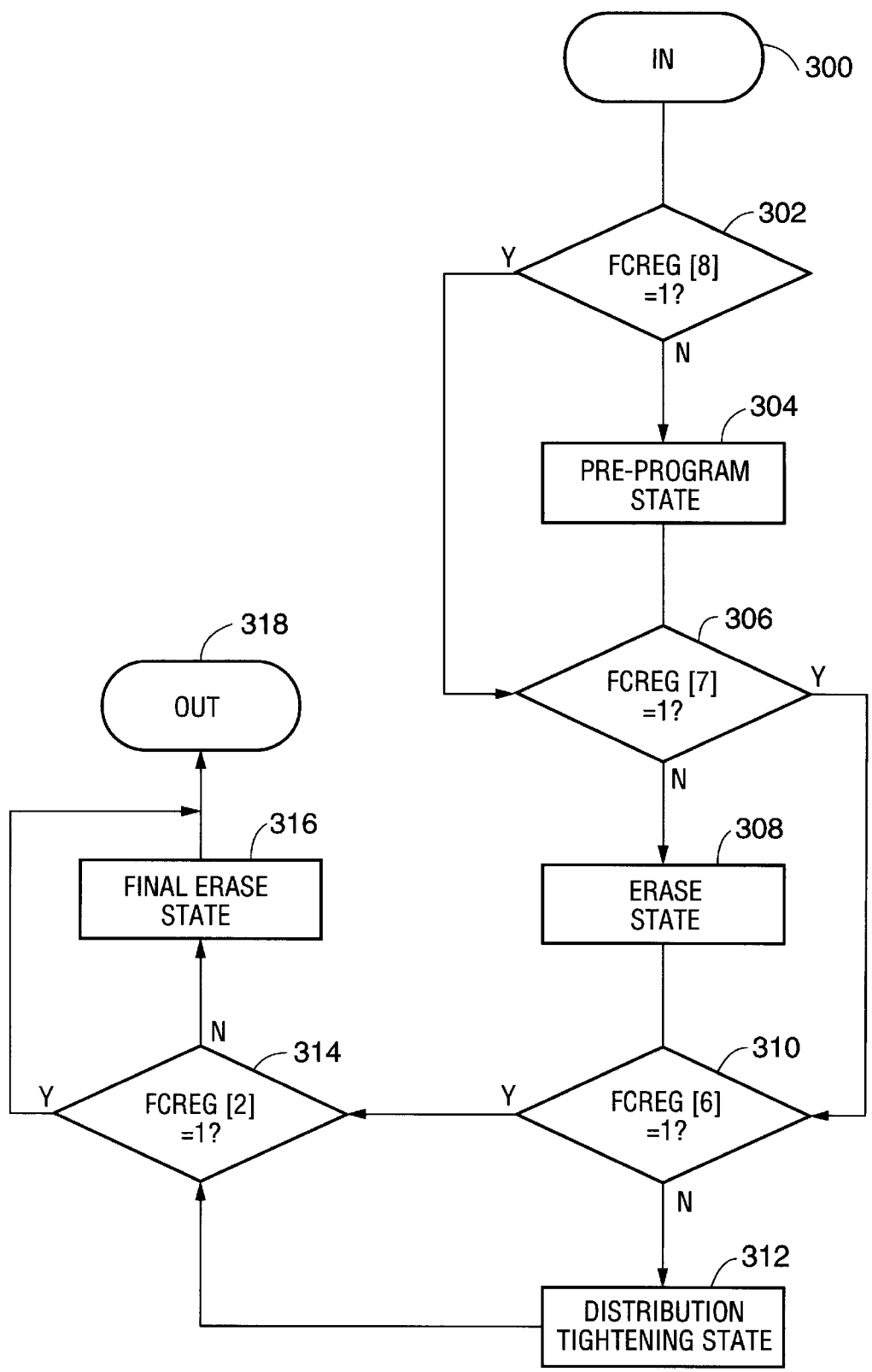
FIGS. 10A–10C are flowcharts showing how the flow control register of the present invention can be used to modify the process flow for each stage of the complete erase operation.
Figure 10B:
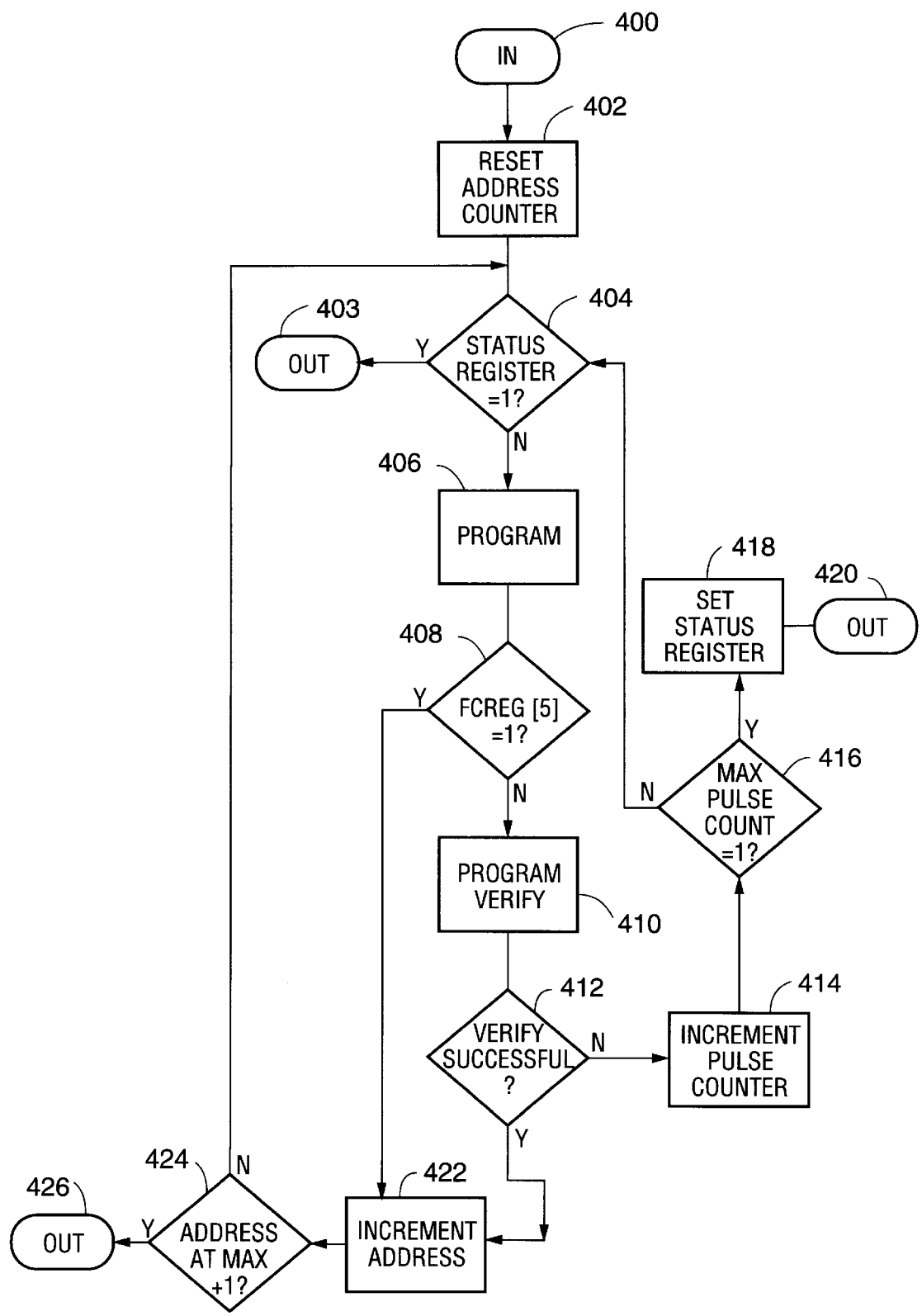
Figure 10C:
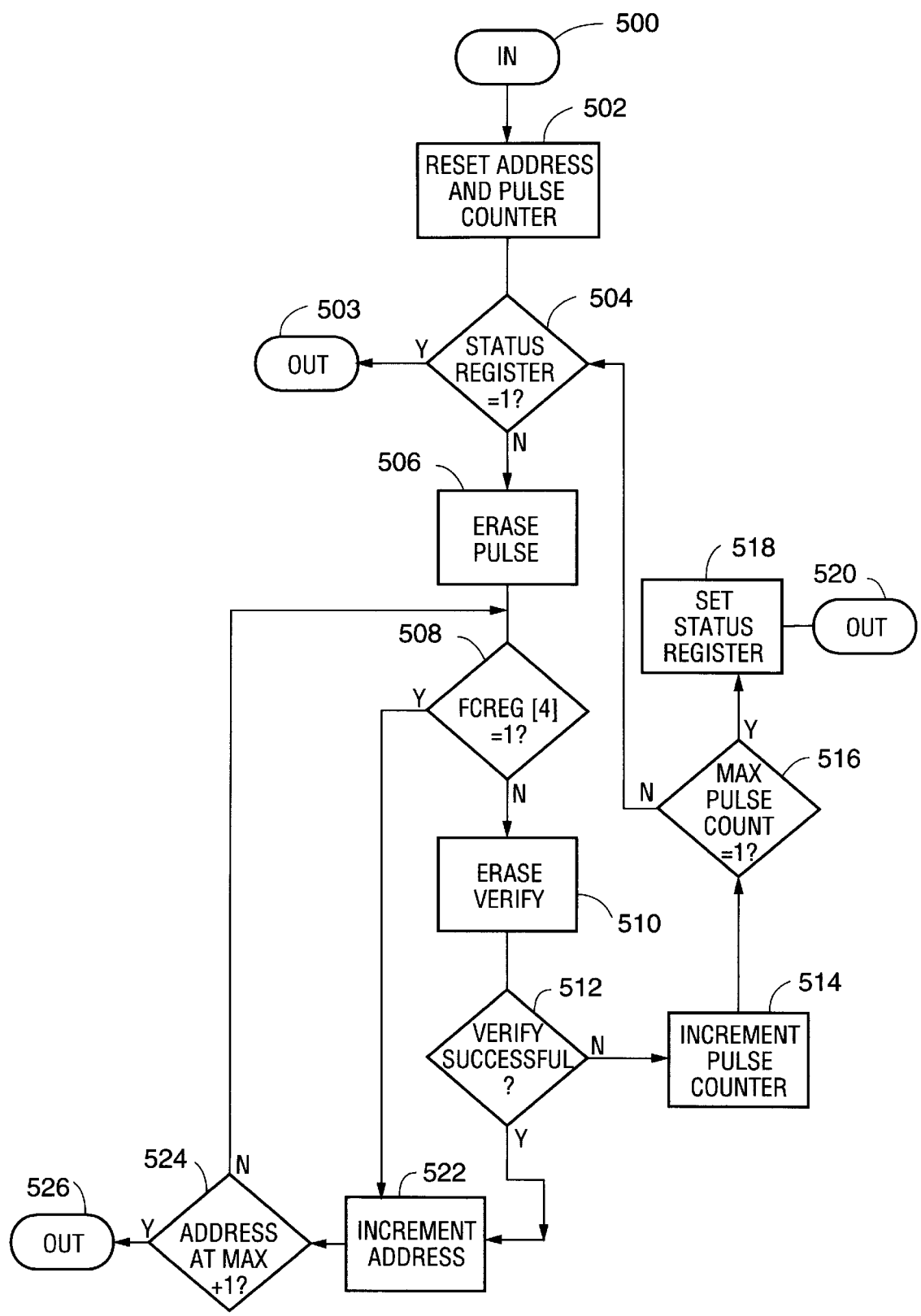

FIGS. 10A–10C are flowcharts showing how flow control register 110 of the present invention can be used to modify the process flow for each stage (sub-operation) of the complete erase operation. FIG. 10A depicts the stages of the complete erase operation, FIG. 10B depicts the pre-program stage, and FIG. 10C depicts the erase stage of the complete erase operation. It is noted that FIGS. 10A–10C are meant to represent examples of how the flow control register can be used to modify the operation of an internal state machine which controls a memory system. Modifications can be made to other stages or sub-operations of the overall operation of the system by altering how the internal state machine controls the execution of the various memory system operations.

As noted, FIG. 10A depicts the stages of the complete erase operation. The process flow enters at step 300. At step 302 a check is performed on the value of bit 8 of the flow control register. If the value of this bit is a one, then the pre-program stage is skipped (see FIG. 4). If the value of the bit is a zero, the pre-program stage is carried out at step 304. After completion of the pre-program stage (or the skipping of that sub-operation), control is passed to step 306 which determines the value of bit 7 of the flow control register. As indicated by FIG. 4, this bit controls whether the high voltage erase sub-operation 308 is carried out. If the value of bit 7 is a one, the sub-operation is skipped and control is passed to step 310. If the value of the bit is a zero, the erase sub-operation is carried out.

The value of bit 6 of the flow control register is determined at step 310. If the value of bit 6 is a one, the distribution tightening sub-operation 312 is skipped and control is passed to step 314. If the value of the bit is a zero, the distribution tightening sub-operation is carried out. The value of bit 2 of the flow control register is then determined at step 314. If the value of bit 2 is a one, the final erase sub-operation 316 is skipped and control is passed out of the complete erase operation cycle to step 318. If the value of the bit is a zero, the final erase sub-operation is carried out.

As noted, FIG. 10B depicts the steps in the pre-program stage of the complete erase operation. The process flow enters at step 400. The address counter, which determines the address of the memory cell accessed during the pre-program sub-operation, is then reset at step 402. At step 404, the value of bit 3 of the status register is checked. This bit provides information regarding the state of the programming voltage level, $V_{PP}$. If there is a problem with the $V_{PP}$ level, no programming or erase operation can be executed. If the value of this bit is a one, control is passed out of the pre-program sub-operation at step 403.

If the value of the bit is a zero, control is passed to step 406 where the programming sub-operation is performed on the specified memory cell. After completion of the programming stage, a check is performed on the value of bit 5 of the flow control register at step 408. If the value of this bit is a one, then the pre-program verify stage is skipped and control is passed to step 422 where the memory cell address is incremented. If the value of the bit is a zero, the pre-program verify stage is carried out at step 410. A test is then performed to determine if the verify sub-operation was successful at step 412. If the verify sub-operation was successful, control is passed to step 422 where the address of the memory cell is incremented.

If the verify sub-operation was unsuccessful, control is passed to step 414 where the pulse counter is incremented. This allows the state machine to track the number of voltage pulses applied to a cell when the programming operation is re-tried on that cell. A test is then performed to determine the value of the maximum pulse counter bit at step 416. This variable is used to prevent an endless cycling of the memory system in an attempt to program a particular cell. If this bit has a value of 1 (indicating that the pulse counter has reached its maximum value) the programming operation has been unsuccessfully attempted the maximum number of possible times and control is passed to step 418 where the bits of the status register are set to indicate that an error has occurred. After setting the status register bits, control is passed out of the pre-program cycle at step 420. If the value of the maximum pulse counter bit determined at step 416 is a zero, then control is passed to step 404 and the cycle continues from that point as before.

As indicated, if the verify sub-operation at step 412 was successful or if the pre-program verify stage was skipped, then the memory cell address is incremented at step 422. A test is then performed at step 424 to determine if the incremented address exceeds the maximum address for the memory block. If the incremented address is less than the maximum address+1, then control is passed back to step 404 and the cycle continues from that point. If the incremented address is equal to the maximum address+1, then control is passed out of the pre-program cycle at step 426.

FIG. 10C depicts the steps in the erase stage of the complete erase operation. The process flow enters at step 500. The address counter, which determines the address of the memory cell accessed during the pre-program sub-operation, and the pulse counter, which tracks the number of high voltage pulses applied to a block of cells, are then reset at step 502. At step 504, the value of bit 3 of the status register is checked. As discussed, this bit provides information regarding the state of the programming voltage level, $V_{PP}$. If the value of this bit is a one, control is passed out of the erase sub-operation at step 503.

If the value of the bit is a zero, control is passed to step 506 where the erase sub-operation is performed on the specified memory block. After completion of the erase stage, a check is performed on the value of bit 4 of the flow control register at step 508. If the value of this bit is a one, then the erase verify stage is skipped and control is passed to step 522 where the memory cell address is incremented. If the value of the bit is a zero, the erase verify stage is carried out at step 510. A test is then performed to determine if the verify sub-operation was successful at step 512. If the verify sub-operation was successful, control is passed to step 522 where the address of the memory cell is incremented.

If the verify sub-operation was unsuccessful, control is passed to step 514 where the pulse counter is incremented. A test is then performed to determine the value of the maximum pulse counter bit at step 516. If this bit has a value of 1 (indicating that the pulse counter has reached its maximum value) the erase operation has been unsuccessfully attempted the maximum number of possible times and control is passed to step 518 where the bits of the status register are set to indicate that an erase error has occurred. After setting the status register bits, control is passed out of the erase cycle at step 520. If the value of the maximum pulse counter bit determined at step 516 is a zero, then control is passed to step 504 and the cycle continues from that point as before.

As indicated, if the verify sub-operation at step 512 was successful or if the erase verify stage was skipped, then the memory cell address is incremented at step 522. A test is then performed at step 524 to determine if the incremented address exceeds the maximum address for the memory block. If the incremented address is less than the maximum address+1, then control is passed back to step 508 and the cycle continues from that point. If the incremented address is equal to the maximum address+1, then control is passed out of the erase cycle at step 526.

As mentioned, FIGS. 10A–10C are examples of operations and sub-operations controlled by an internal state machine which can be altered by means of the flow control register of the present invention. One skilled in the art will recognize that other operations or sub-operations performed on the memory cells of the memory system can similarly be skipped or modified as to the order in which they are carried out by setting bits of the flow control register. The bits of the flow control register are used as inputs to logic circuits which determine whether a particular data processing operation is initiated. This permits a memory system designer to evaluate how well each stage of the data processing operations performs and the impact of each stage on the memory.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

We claim:

1. A method of operating a memory system which includes a plurality of memory cells and on which are executed a sequence of operations and sub-operations under the control of a state machine, the memory system having a standard mode of operation in which a user can program, erase, and read a memory cell and a non-standard mode of operation, wherein access to the non-standard mode of operation occurs upon detection of a non-standard mode access state different from states which occur during the standard mode of operation, the method comprising:

applying a signal corresponding to a non-standard mode access state to the memory system;

detecting the non-standard mode access state, causing the memory system to enter the non-standard mode of operation; and setting a control parameter of a flow controller, wherein the flow controller alters the sequencing of the operations and sub-operations executed by the state machine in the standard mode of operation in response to the control parameter, wherein setting a control parameter of a flow controller further comprises:

programming a data storage unit which is part of the flow controller with data representing a value of the control parameter comprising inputting data representing the value of the control parameter to the data storage unit, and transferring the input data to a memory device.

2. The method of claim 1, further comprising:

executing the altered sequence of operations and sub-operations in the standard mode of operation of the memory system.

3. A method of operating a memory system which includes a plurality of memory cells and on which are executed a sequence of operations and sub-operations under the control of a state machine, the method comprising:

setting a control parameter of a flow controller which alters the sequencing of the operations and sub-operations executed by the state machine, wherein setting a control parameter of a flow controller comprises programming a data storage unit which is part of the flow controller with data representing a value of the control parameter;

wherein programming the data storage unit further comprises inputting data representing the value of the control parameter to the data storage unit, and transferring the input data to a memory device; and executing the altered sequence of operations and sub-operations on the memory cells.

4. An integrated circuit memory device comprising:

a state machine configured to control a sequence of preprogrammed operations performed on the integrated circuit memory device, wherein the state machine controller comprises a programmable flow control register, and program circuitry configured to program the flow control resister; and a programmable state machine controller configured to cause the state machine to alter the sequence of preprogrammed operations; the flow control register stores a plurality of data bits, each bit corresponding to an operation of the sequence of operations, a first sequence of operations is performed on the integrated circuit memory device if a corresponding flow control register data bit is in a first logic state, and a second sequence of operations is performed on the integrated circuit memory device if a corresponding flow control register data bit is in a second logic state.

5. The integrated circuit memory device of claim 4, wherein the flow control register is programmed during a memory device test mode operation.

6. The integrated circuit memory device of claim 4, wherein the sequence of operations performed on the integrated circuit memory device include a function to erase data stored in a memory cell.

7. The integrated circuit memory device of claim 4, wherein the sequence of operations performed on the integrated circuit memory device include a function to read data stored in a memory cell.

8. The integrated circuit memory device of claim 4, wherein the sequence of operations performed on the integrated circuit memory device include a function to program a memory cell to store data.

9. A flash memory device comprising:

an array of non-volatile memory cells;

a state machine configured to control a sequence of operations performed on the flash memory device;

a state machine controller configured to cause the state machine to alter a flow of the sequence of operations;

a programmable flow control register operable to store data indicating a desired operation sequence flow; and test mode detection circuitry operable to detect an externally applied trigger signal and further operable to initiate a test mode wherein the programmable flow control register can be programmed;

wherein the flow control register stores a plurality of data bits, each bit corresponding to an operation of the sequence of operations, and wherein a first sequence of operations is performed on the integrated circuit memory device if a corresponding flow control register data bit is in a first logic state, and a second sequence of operations is performed on the integrated circuit memory device if a corresponding flow control register data bit is in a second logic state.

10. The flash memory device of claim 9, further comprising:

switching circuitry for coupling data stored in the programmable flow control register to an external data communication connection.

11. A method of testing an integrated circuit memory device, comprising:

initiating a test mode;

programming a flow control register to store state machine operation flow instructions, wherein programming the flow control register further comprises:

storing a plurality of data bits, provided on a plurality of address input connections, in the flow control register, each bit corresponding to an operation of a sequence of operations which can be performed by the state machine, if a corresponding flow control register data bit is in a first logic state then a first sequence of operations is performed on the integrated circuit memory device, and if a corresponding flow control register data bit is in a second logic state then a second sequence of operations is performed on the integrated circuit memory device; and controlling a state machine operation based upon contents of the programmed flow control register.

12. The method of claim 11, further comprising:

operating the memory device using the state machine;

evaluating a performance of the memory device; and reprogramming the flow control register to store new state machine operation flow instructions based upon the performance evaluation.

13. The method of claim 11, wherein the test mode is initiated using an externally provided signal.

14. The method of claim 13, wherein the externally provided signal is a voltage provided on an external connection which exceeds a predetermined voltage level.

15. The method of claim 11, wherein programming a flow control register is automatically performed during a supply voltage power-up stage.

16. A method of evaluating a flash memory having a state machine for controlling an operation performed on memory cells, the state machine having X possible states, the method comprising the steps of:

programming a state machine controller using externally applied signals, programming the state machine controller comprises initiating a test mode of operation of the flash memory device, providing signals to the flash memory device on address input connections, and storing the signals in a control resister, the control register stores an X-bit data package, each bit of the X-bit data package corresponding to one state of the X possible states; and operating the state machine in response to the state machine controller to perform a sequence of Y states which is less than the X possible states, operating the state machine further comprises performing a state of the X possible states if a corresponding bit of the X-bit data package is in a first logic state, and bypassing a state of the X possible states if a corresponding bit of the X-bit data package is in a second logic state.

17. A memory device comprising:

an array of memory cells;

a state machine configured to control an operation performed on the array of memory cells, the operation comprising a sequence of Y steps selected from X possible sub-steps;

a control register to store an X-bit data package;

a state machine controller configured to define the sequence of Y steps; and a programming circuit configured to program the state machine controller in response to externally provided signals to change the sequence of Y steps such that each one of the Y steps is performed if a corresponding bit of the X-bit data package is in a first logic state.

* * * * *